United States Patent [19]
Choi

[11] Patent Number: 5,999,471
[45] Date of Patent: Dec. 7, 1999

[54] SEMICONDUCTOR MEMORY DEVICE HAVING A REFRESH FUNCTION AND A METHOD FOR REFRESHING THE SAME

[75] Inventor: Jong-hyun Choi, Kyungki-do, Rep. of Korea

[73] Assignee: Samsung Electronics, Co., Ltd., Suwon, Rep. of Korea

[21] Appl. No.: 09/016,831

[22] Filed: Jan. 30, 1998

[30] Foreign Application Priority Data

Jan. 30, 1997 [KR] Rep. of Korea ..................... 97/972879

[51] Int. Cl.$^6$ ....................................................... G11C 7/00
[52] U.S. Cl. ..................... 365/222; 365/230.03; 365/194
[58] Field of Search .............................. 365/222, 230.03, 365/194

[56] References Cited

U.S. PATENT DOCUMENTS

| | | | |
|---|---|---|---|
| 5,251,176 | 10/1993 | Komatsu | 365/222 |
| 5,373,475 | 12/1994 | Nagase | 365/222 |
| 5,495,452 | 2/1996 | Cha | 365/222 |
| 5,608,682 | 3/1997 | Jinbo et al. | 365/222 |
| 5,708,611 | 1/1998 | Iwamoto et al. | 365/222 |
| 5,715,206 | 2/1998 | Lee et al. | 365/222 |
| 5,719,815 | 2/1998 | Takahashi et al. | 365/222 |
| 5,831,921 | 11/1998 | Tsukude | 365/222 |

*Primary Examiner*—David Nelms
*Assistant Examiner*—Gene N. Auduone
*Attorney, Agent, or Firm*—Marger Johnson & McCollom, P.C.

[57] ABSTRACT

A refresh method for a semiconductor memory device reduces the magnitude of the peak current drawn from the power supply. Multiple memory cells coupled to a plurality of word lines are refreshed at one time in order to reduce stand-by power consumption in the refresh mode. Such refresh mode can include automatic refresh or self refresh modes. A plurality of word lines are selected and multiple bit line sense amplifiers corresponding to the selected word lines are activated for the refresh operation. The selected plurality of bit line sense amplifiers are divided into two or more groups and the points in time at which the bit line sense amplifiers are enabled are different for each group. The selected word line and the selected bit line sense amplifiers are then disabled. Thus, the magnitude of the peak current is reduced by dispersing the points in time at which the bit line sense amplifiers are enabled, thereby preventing system misoperation by excessive peak currents in a battery powered system.

19 Claims, 28 Drawing Sheets

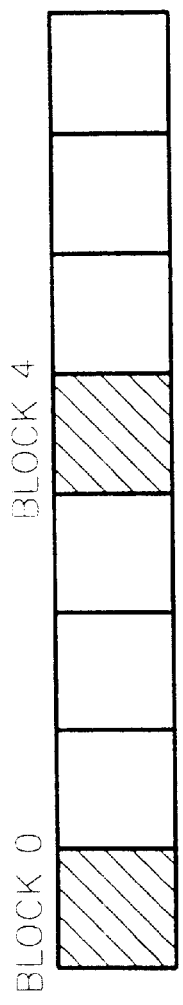
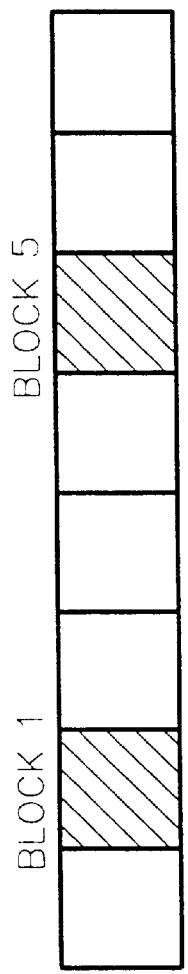
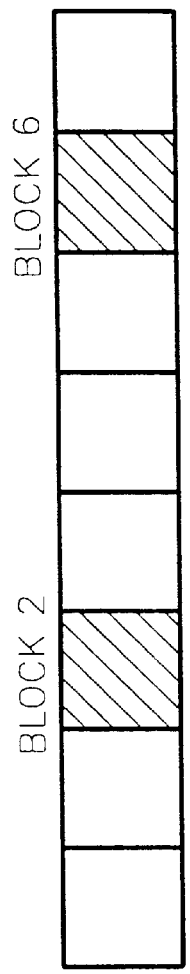
FIG. 2A (PRIOR ART)
FIG. 2B (PRIOR ART)
FIG. 2C (PRIOR ART)
FIG. 2D (PRIOR ART)

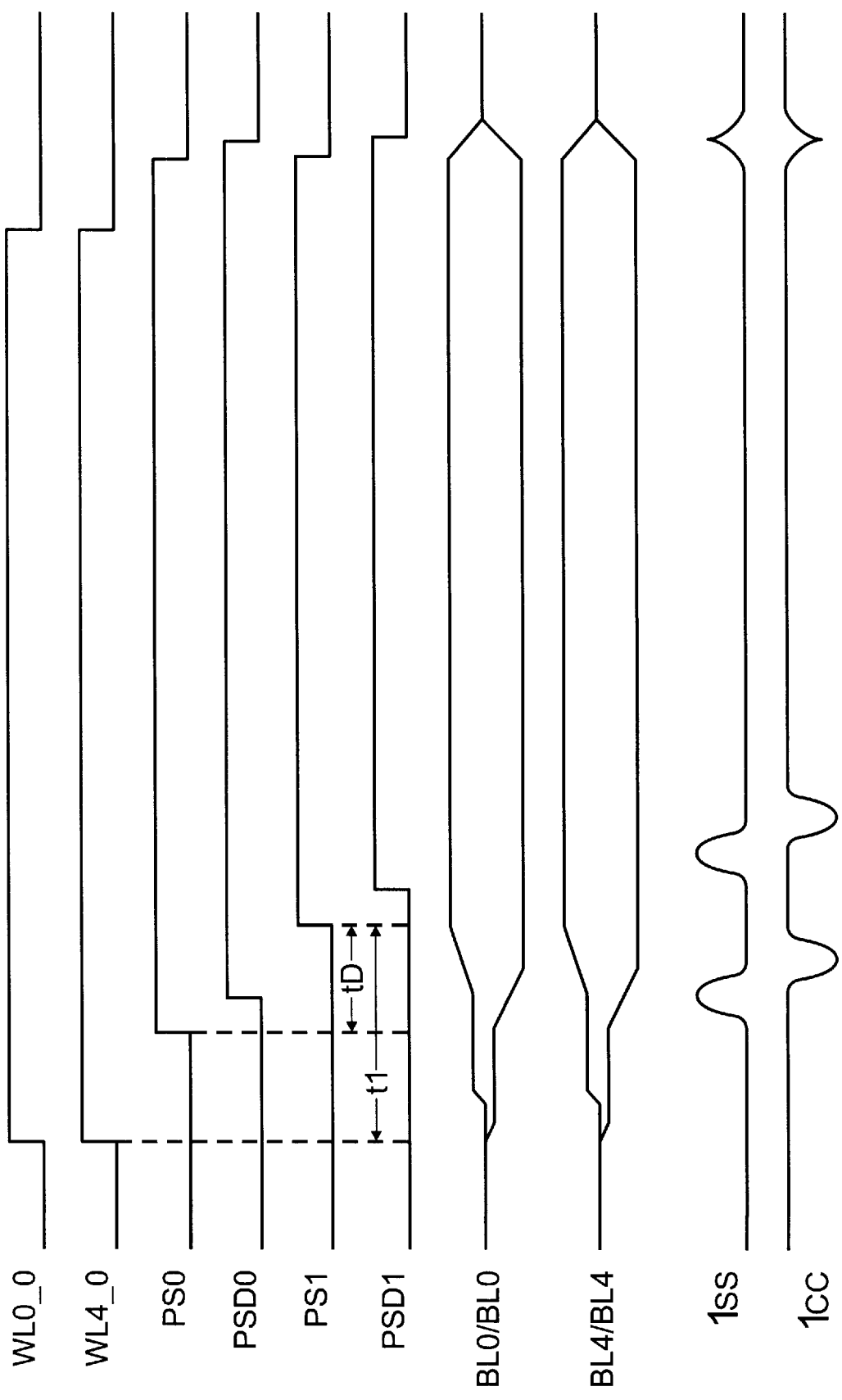

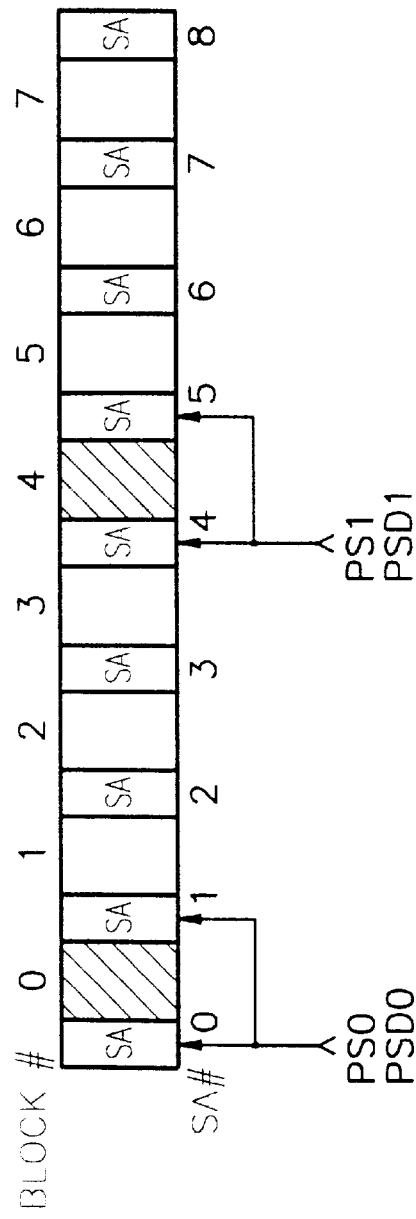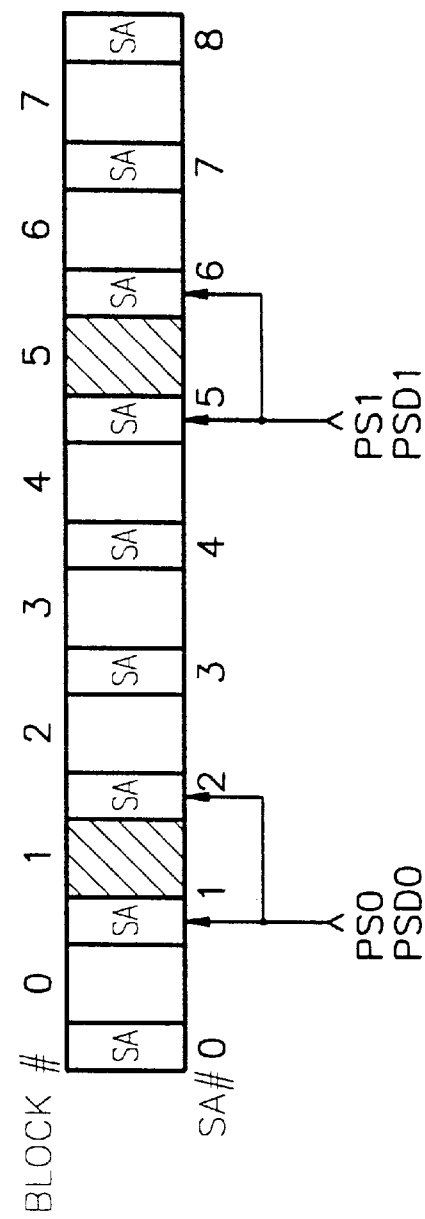
FIG. 17A
FIG. 17B

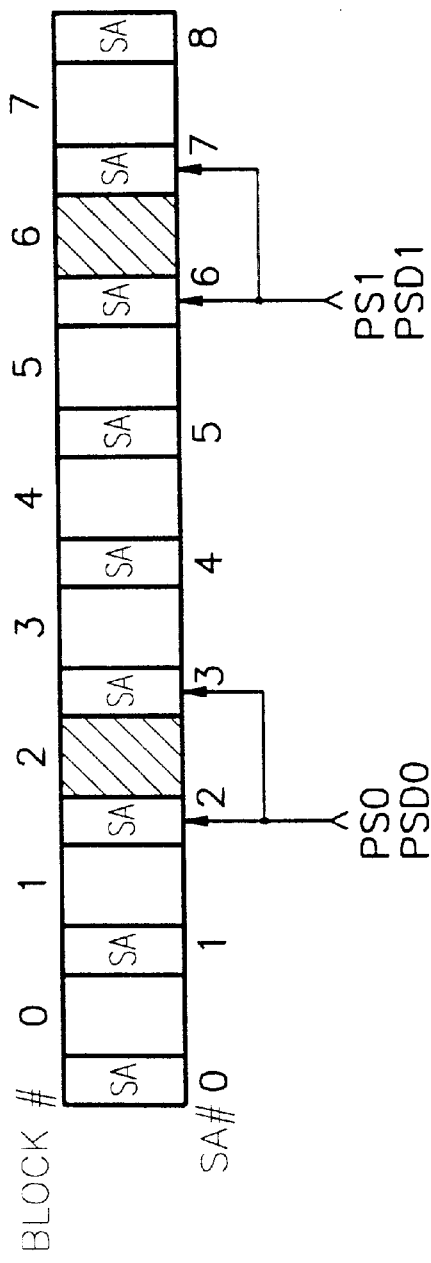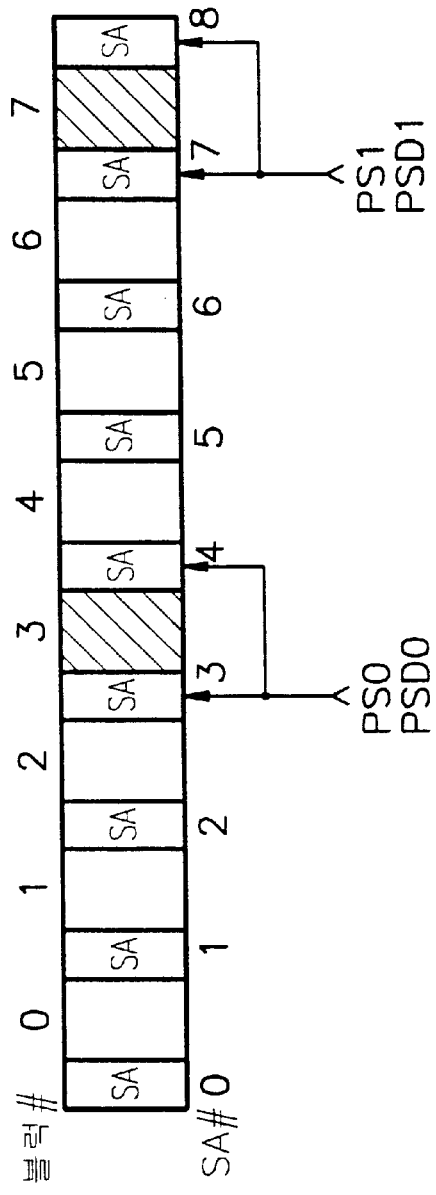
FIG. 17C
FIG. 17D

SEMICONDUCTOR MEMORY DEVICE HAVING A REFRESH FUNCTION AND A METHOD FOR REFRESHING THE SAME

BACKGROUND OF THE INVENTION

The present invention relates to a semiconductor memory device, and more particularly, to a method for refreshing data in a dynamic random access memory (DRAM) and a circuit therefor.

Volatile memory devices such as dynamic random access memory (DRAM) require refreshing data stored in the individual memory cells at periodic intervals. Typically, the memory cell of the DRAM comprises an access transistor and a capacitor and the data is expressed as electric charge accumulated in the capacitor. For a variety of reasons the capacitor charge leaks. If the leak is severe enough, data is lost. Therefore, it is necessary to restore the capacitor charge before data is permanently lost. The operation of restoring capacitor charge is called refresh. All of the memory cells included in the semiconductor memory device should be refreshed at least once every refresh period tREF. The refresh operation is divided into a row address signal (RAS) only refresh ROR or self refresh. Where a ROR refresh is desired, the row address is input externally to the semiconductor device. On the other hand, if a self refresh is performed, the row address is internally generated.

FIG. 1 is a diagram of a typical refresh circuit for a DRAM memory cell. Referring to FIG. 1, memory cell 110 comprises access transistor 101 and capacitor 102. The drain of the access transistor 101 is connected to a bit line (BL). The gate of the access transistor 101 is connected to a word line WL. The capacitor 102 is connected between the source of the access transistor 101 and a plate voltage P. As mentioned above, the data is expressed by the amount of charge accumulated in the capacitor 102. A bit line equalizer/precharger 120 includes three NMOS transistors 121, 122, and 123. A bit line sense amplifier 130 includes two cross-coupled PMOS transistors 131 and 132 and two cross-coupled NMOS transistors 133 and 134.

During the refresh operation, the word line is activated to a logic "high" level turning on the access transistor 101. The charge accumulated in the capacitor 102 is distributed to the bit line. Namely, a charge sharing operation is performed by the capacitor 102 changing the bit line capacitance and the voltage level of the bit line BL accordingly. Subsequently, bit line sense amplifier driving signals LAPG and LANG are sequentially activated. When the bit line sense amplifier driving signal LAPG is activated to a logic "low" PMOS transistor 135 is turned on and the signal LA changes to power supply VCC. When the bit line sense amplifier driving signal LANG is activated to a logic "high", signal LAB changes to ground power supply VSS. A voltage difference between the bit line BL and the inverse bit line /BL is amplified by the bit line sense amplifier 130. The amount of charge accumulated in the capacitor 102 is increased by such a bit line sense amplifying operation. Subsequently, the word line and the bit line sense amplifier driving signals are deactivated and a bit line equalizing signal PEQ is activated to a logic "high", precharging the bit line BL and the inverse bit line /BL to a voltage level VBL. The VBL level generally has an intermediate voltage value between the voltage level of logic high or "1" data and the voltage level of logic low data or "0". Also, the bit line BL and the inverse bit line /BL are electrically isolated from the input and output line during the time when the bit line sense amplifying operation is performed. Such a refresh operation is performed at least once every refresh period tREF in order to preserve the data stored in the memory cell.

It takes time to perform a refresh operation on all the memory cells. For example, in a semiconductor memory device which has 1 megabyte capacity and 512 word lines, 512 refresh cycles are required if a single word line is actuated at a time. 256 refresh cycles are required if two word lines are actuated at a time. Therefore, the refresh operation should be performed on as many word lines at one time as possible in order to reduce the number of refresh cycles.

Reducing the number of refresh cycles is particularly important for stably performing the refresh operation and for reducing average power consumption. The refresh operation with respect to one memory cell should be completed within 15.6 μs where 512 refresh cycles are required and the refresh period tREF is 8 ms, while the refresh operation with respect to one memory cell should be completed within 31.2 μs where 256 refresh cycles are required and the refresh period tREF is 8 ms. Since the refresh operation is performed by the word line activating operation, the charge sharing operation, and the bit line sense amplifying operation, as described above, the capacitor charge is not properly restored unless enough time is secured to do so.

Also, the power consumed by the refresh operation can be divided into the power consumed in the memory cell array and the power consumed in the driving circuit for driving the memory cell array. Since all the cells are activated once during the refresh period tREF, the power consumed in the memory cell array is constant. However, since the number of times in which a peripheral circuit for driving the memory cell array is activated for the refresh operation is proportionate to the number of refresh cycles, the power consumed by the peripheral circuit can be reduced by reducing the number of refresh cycles.

Reducing average power consumption has become more important as the use of portable electronic equipment driven by a battery increases. Since most of the power consumed by the semiconductor memory device in sleep mode is consumed by the refresh operation, the refresh operation in sleep mode should be designed to adequately refresh the stored data while minimizing current consumption. The current consumed during the refresh operation can be calculated using the following formula 1.

$$I_{SR-current} = I_{refresh} \frac{(t_{ref} N_{cycle})}{tREF} + I_{standby} \quad \text{FORMULA 1}$$

Where:

$I_{SR-current}$=average current consumed during the refresh mode;

tREF=refresh period of the semiconductor memory device;

$t_{ref}$=actual time in which the refresh operation is performed during one refresh cycle;

$N_{cycle}$=number of refresh cycles included in one refresh period;

$I_{refresh}$=average current consumed in one tREF;

$I_{standby}$=current consumed during standby mode.

As can be gleaned from formula 1, to reduce current $I_{SR-current}$ it is necessary to either increase tREF or reduce $t_{ref}$ or $N_{cycle}$. The maximum refresh period tREF is typically around 200 ms at 83° C. Thus, tREF can be increased only by a limited amount. There is also a limitation in reducing $t_{ref}$ since a certain minimum time is required for restoring the charges which have been leaked. Therefore, a method for reducing $N_{cycle}$ becomes an efficient way of reducing the current and consequent power consumed. $I_{refresh}$ is not affected by the changes of tREF and $t_{ref}$ but is affected by the change of $N_{cycle}$. This is because the current consumed by the memory cell array and the peripheral circuit are included in $I_{refresh}$. When the number of all of the word lines is $N_{wordline}$ and the number of the word lines in which the refresh operation is performed at one time is $N_{ref-wl}$, the number of $N_{cycles}$ can be calculated using the following formula 2.

$$N_{cycle} = \frac{N_{wordline}}{N_{ref-wl}} \qquad \text{FORMULA 2}$$

Therefore, $N_{ref-wl}$ should be increased to reduce $N_{cycle}$. When $N_{ref-wl}$ is increased, the peak current increases since the number of memory cells which are refreshed at one time increases. However, the average current consumed is reduced since the number of refresh cycles decreases.

FIGS. 2A to 2D explain a conventional refresh method for reducing the number of the refresh cycles. In FIGS. 2A to 2D, the memory cell array is constructed by eight blocks. Generally, a plurality of word lines and a plurality of bit lines are included in one block and a memory cell is formed at the intersecting point of the word and bit lines. In FIGS. 2A to 2D, a refresh operation on two blocks is simultaneously performed. Namely, block 0 and block 4 are simultaneously refreshed (FIG. 2A) followed by sequentially and simultaneously refreshing block 1 and block 5 (FIG. 2B), block 2 and block 6 (FIG. 2C), and block 3 and block 7 (FIG. 2D). The refresh operation of one block is not performed at one time with respect to all the memory cells included in the block but is performed in a word line unit. Namely, a predetermined word line is selected among the plurality of word lines included in the block and the refresh operation is performed with respect to the memory cells combined thereto. Then, the refresh operation with respect to the memory cells combined to the next word line is performed. Therefore, the number of refresh cycles required to perform a refresh operation with respect to one block equals the number of the word lines included in the block. For example, where 512 word lines are formed in one block, the number of refresh cycles with respect to one block is 512. Also, where the refresh operation is performed with respect to one block at a time, the required number of refresh cycles is 8×512 where 8 blocks exist. Since two blocks are simultaneously refreshed as is shown in FIGS. 2A to 2D, the required number of refresh cycles is reduced by half becoming 4×512.

Waveforms for describing the refresh operations with respect to block 0 and block 4 are shown in FIG. 3. The word line WL0_0 included in block 0 and the word line WL4_0 included in block 4 are simultaneously activated and the refresh operation with respect to the memory cells combined thereto is performed. Then, the word line WL0_0 and the word line WL4_0 which were selected are deactivated. The word line WL0_1 included in the block 0 and the word line WL4_1 included in block 4 are activated and the memory cells combined thereto are refreshed. The memory cells combined to the word lines WL0_2 and WL4_2 are refreshed and the rest memory cells are refreshed in the same manner in the next refresh cycle. In FIG. 3, the word lines are sequentially selected, however, the word lines may be selected in a different way. For example, the sequence in which the word lines are selected can be changed using scramble logic. However, more than two word lines included in different blocks are simultaneously activated and the memory cells combined thereto are refreshed in such a case.

As mentioned above, the refresh cycles are reduced in order to stabilize the refresh operation and reduce the average power consumed. Reducing the average consumed power is more critical where the semiconductor memory device is used in a battery operated system. For example, in a battery operated system such as a notebook PC or a laptop computer, it is very important to reduce the average power consumption since the power supplied by the battery is very limited. Therefore, as shown in FIGS. 2A to 2D and 3, it is very important to simultaneously select a plurality of word lines and to perform a refresh operation on the memory cells associated with the selected word lines (hereinafter "a plurality of word lines refresh method") in a volatile semiconductor memory device. However, a disadvantage of using the plurality of word lines refresh method is that peak currents increases as described in FIG. 4.

FIG. 4 shows the respective signal waveforms in one refresh cycle for the plurality of word lines refresh method. Referring to FIG. 4, the bit line and the inverse bit line are precharged to the VBL level before the word lines are selected. In such a state, a plurality of word lines WL0_0 and WL4_0 are selected and are activated to a logic "high" level. When the word line is activated, the access transistors of the memory cells combined thereto are turned on and the voltage levels of the bit line and the inverse bit line change according to the data stored in the memory cell. The bit line sense amplifier enable signals PS and PSD are activated to a logic "high" level, amplifying the voltage difference between the bit line BL and the inverse bit line /BL. The bit line sense amplifier enable signals PS and PSD have identical waveforms regardless of the word line selected. Namely, the bit line sense amplifying operations in all the bit lines and inverse bit lines included in the selected block are simultaneously activated. Thus, the power current $I_{CC}$ and the earth current $I_{SS}$ instantaneously increase as shown in FIG. 4. The peak value of the power current $I_{CC}$ and the earth current $I_{SS}$ increase as the number of the word lines activated at a single time increases. In other words, as the number of the blocks selected at one time increases, the peak current increases. Here, BL0 and /BL0 respectively denote the signal waveforms of the bit lines and the inverse bit lines included in block 0 and BL4 and /BL4 respectively denote the signal waveforms of the bit lines and the inverse bit lines included in block 4. In a battery powered system, the battery is damaged when the peak current increases. As a result, the system may not operate properly generating otherwise avoidable system errors. The system may also fail because the current supplied by the battery is limited. Therefore, it is necessary to lower the peak current drawn by the system. One proposed solution has been to increase the number of the word lines selected within a block to reduce the average power consumption and to stabilize the refresh operation. However, as the number of the selected word lines increases, the peak current is increased.

SUMMARY OF THE INVENTION

It is an object of the present invention to overcome the disadvantages associated with prior art refresh methods and circuits therefor.

It is another object of the present invention to provide a refresh method for a semiconductor memory device which reduces stand-by power consumption and lowers peak current in the self refresh mode.

It is yet another object of the present invention to provide a refresh circuit for a semiconductor memory device which reduces stand-by power consumption and lowers peak current consumption in the self refresh mode.

The invention provides a method for refreshing data stored in memory cells of a semiconductor memory device which reduces the magnitude of the peak current drawn from the power supply. Multiple memory cells combined to a plurality of word lines are refreshed at one time in order to reduce stand-by power consumption in the refresh mode. Such refresh mode can include automatic refresh or self refresh modes. A plurality of word lines are selected and multiple bit line sense amplifiers corresponding to the selected word lines are activated for the refresh operation. Two or more word lines are enabled followed by enabling a first bit line sense amplifier corresponding to one of the two or more enabled word lines during a first time period. Also, a second bit line sense amplifier corresponding to another of the two or more word lines is enabled during a second time period. A bit line dispersion delay time is interposed between the first time period and the second time period. The method further includes refreshing the data stored in the memory cells, disabling the enabled word lines, and disabling the enabled bit lines.

The word lines can also be enabled sequentially with a word line dispersion delay time interposed between enabled word lines.

The method further includes equalizing the bit lines and the inverse bit lines.

The enabled word lines are disabled either simultaneously or sequentially with a second word line dispersion delay time interposed between two disabled word lines.

Enabling the bit line sense amplifiers comprises driving the NMOS transistors of the bit line sense amplifiers and driving the PMOS transistors of the selected bit line sense amplifiers where the bit line sense amplifiers include a pair of cross coupled PMOS transistors and a pair of cross coupled NMOS transistors.

The selected plurality of bit line sense amplifiers are divided into two or more groups and the points in time at which the bit line sense amplifiers are enabled are different for each group. For example, the plurality of bit line sense amplifiers are divided so that the bit line sense amplifiers corresponding to like column lines belong to a single group.

The invention further provides a refresh circuit for a semiconductor memory device having a plurality of memory cells formed at intersecting points of a plurality of word lines with a plurality of bit lines. The refresh circuit includes a plurality of bit line sense amplifiers coupled to groups of bit lines and a control circuit for generating a refresh mode signal.

A block select signal generating circuit for generating a plurality of block select signals responsive to the refresh mode signal is also included in the refresh circuit. Two or more block select signals of the plurality of block select signals are enabled when the refresh mode signal is in a first logic state. A bit line sense amplifier enable signal generating circuit generates a plurality of bit line sense amplifier enable signals responsive to the refresh mode signal; each of the enabled signals are sequentially enabled with a bit line dispersion delay time interposed between each enabled bit line sense amplifier signal. The refresh circuit also includes a bit lines sense amplifier driving circuit for driving the plurality of bit line sense amplifiers responsive to the bit line sense amplifier enable signal and corresponding block select signals. A counter for generating a memory row address and a row active signal generating circuit for generating a row active signal responsive to the refresh mode is also included.

The plurality of bit line sense amplifiers are shared by adjacent blocks. When the semiconductor memory device comprises eight blocks (a block 0 to a block 7, for example) and nine shared bit line sense amplifying portions (SA0 to SA8), the block select signal generating portion generates eight block select signals (BLK_0 to BLK_7) such that block 0 and block 4 are selected in a first block refresh cycle, block 1 and block 5 are selected in a second block refresh cycle, block 2 and block 6 are selected in a third block refresh cycle, and block 3 and block 7 are selected in a fourth block refresh cycle. The bit line sense amplifier enable signal generating portion generates the bit line sense amplifier enable signals PS0 and PSD0 and the bit line sense amplifier enable signals PS1 and PSD1 which are enabled at dispersed points in time.

A timing control signal generating portion for generating a timing control signal PSE responsive to the row active signal PR is provided in the refresh circuit. The bit line sense amplifier enable signal generating portion comprises first buffering means for generating a bit line sense amplifier enable signal PS0 by delaying and buffering the timing control signal PSE, a first delaying portion for generating a bit line sense amplifier enable signal PSD0 by delaying the bit line sense amplifier enable signal PS0, and a dispersion delay portion for delaying and outputting the timing control signal PSE in case the refresh mode signal PSR is enabled. The bit line sense amplifier enable signal generating portion further comprises second buffering means for outputting the bit line sense amplifier enable signal PS1 by delaying and buffering the timing control signal PSE in case the refresh mode signal PSR is deactivated and outputting the bit line sense amplifier enable signal PS1 by delaying and buffering the output of the dispersion delay portion in case the refresh mode signal PSR is active and a second delay portion for outputting the bit line sense amplifier enable signal PSD1 by delaying the bit line sense amplifier enable signal PS1.

BRIEF DESCRIPTION OF THE DRAWINGS

The above objects and advantages of the present invention will become more apparent by describing in detail a preferred embodiment thereof with reference to the attached drawings in which:

FIGS. 2A to 2D are block diagrams describing the conventional refresh method for reducing the number of refresh cycles;

FIG. 5 is a signal diagram of the refresh method for a semiconductor memory device according to the present invention;

FIGS. 17A to 17D and 18 are block diagrams of the plurality of word lines refresh method for the semiconductor memory device;

FIG. 18 is a timing diagram of the refresh method shown in FIGS. 17A–17O;

DETAILED DESCRIPTION OF A PREFERRED EMBODIMENT

FIG. 5 shows signal waveforms of the refresh method for a semiconductor memory device according to the present invention, and in particular, the signal waveforms for the case where refresh operations with respect to two word lines are simultaneously performed.

Bit lines and inverse bit lines are precharged to a voltage level VBL before the refresh cycle begins. At least two blocks are selected among the plurality of blocks and one word line WL0_0 or WM4_0 is selected in each selected block and is activated to a logic "high" level. When the word line is activated, a charge sharing operation occurs between the bit lines and the selected word lines and the voltage level of the bit lines and the inverse bit lines varies according to data stored in the memory cell.

Figure 1:
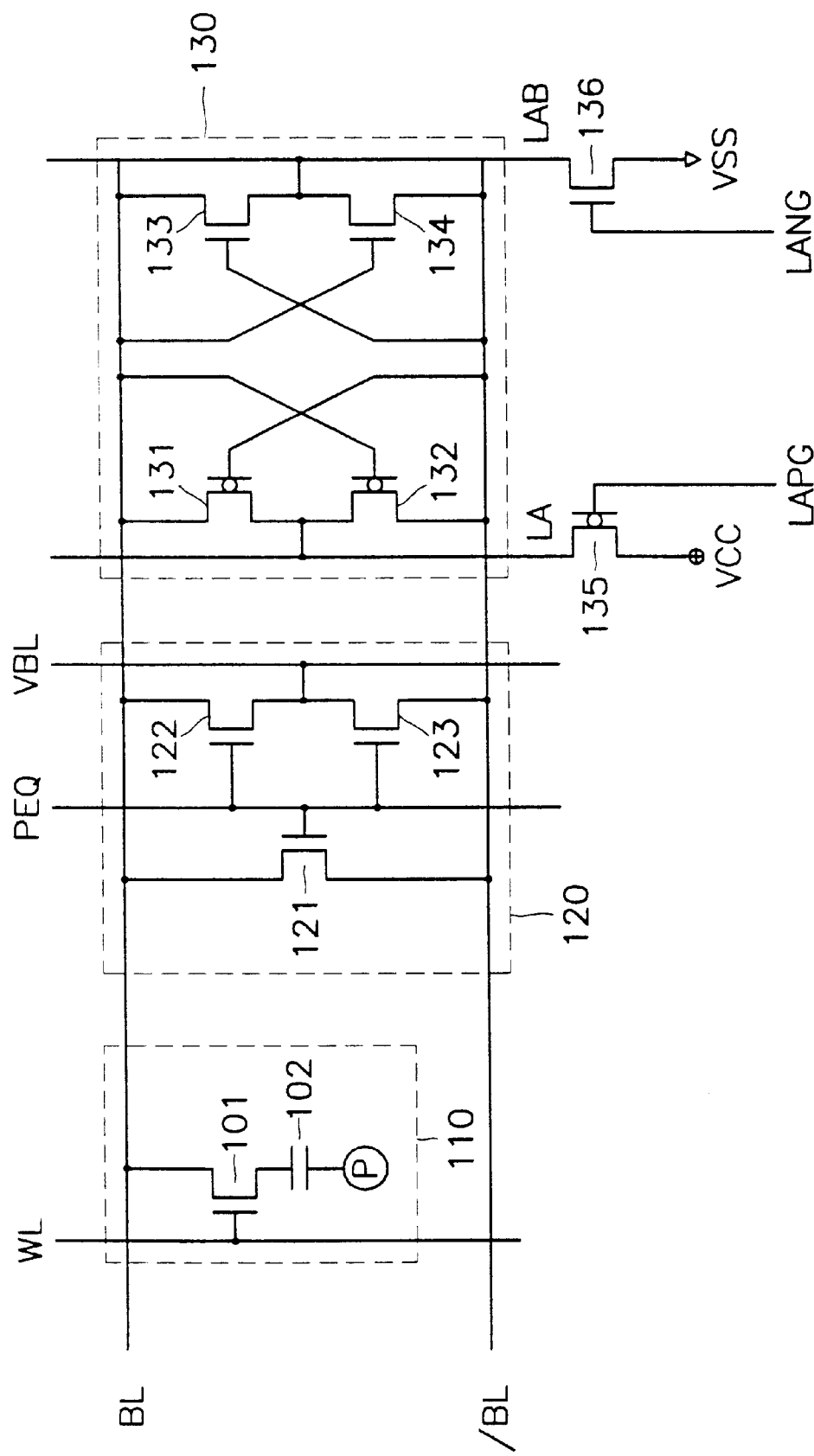
FIG. 1 is a circuit diagram of a conventional DRAM memory cell and related refresh circuitry.
Figure 3:
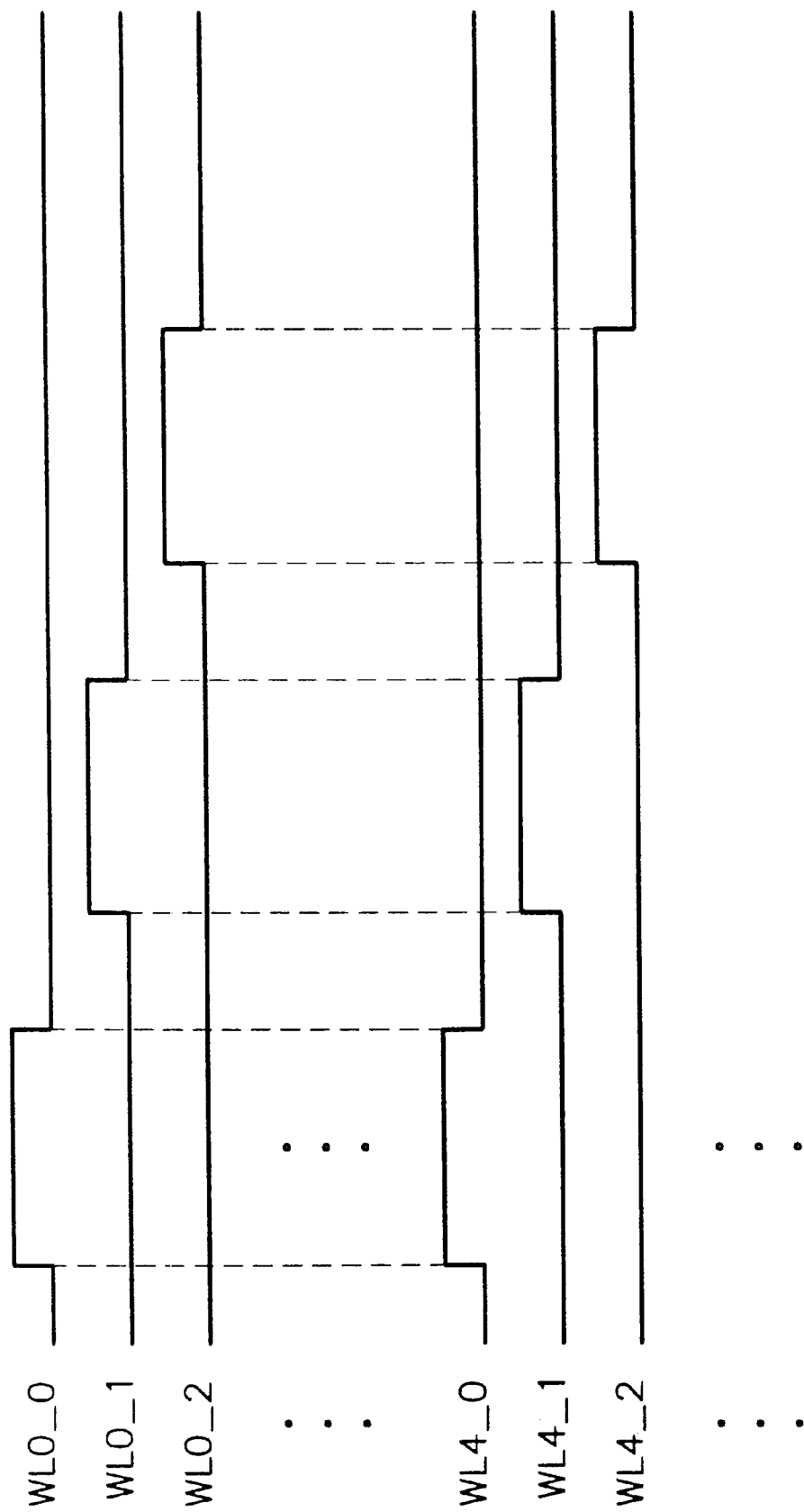
FIG. 3 is a timing diagram of the refresh method shown in FIG. 2A.
Figure 4:
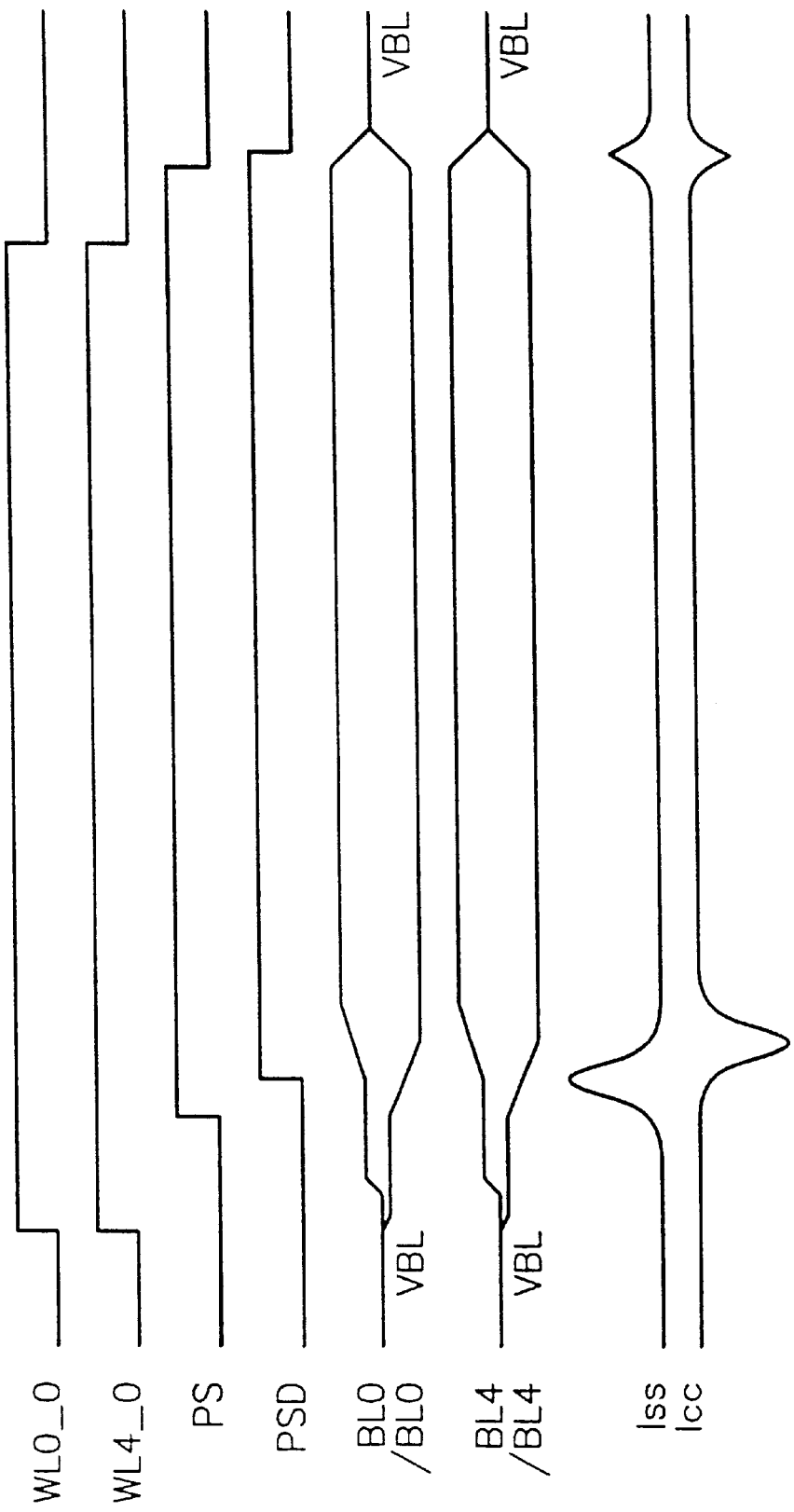
FIG. 4 is a signal diagram of the refresh method shown in FIG. 2A.

Thereafter, bit line sense amplifier enable signals PS0 and PSD0 corresponding to the word line WL0_0 are sequentially activated to a logic "high" level and bit line sense amplifier enable signals PS1 and PSD1 corresponding to the word line WL4_0 are sequentially activated to a logic "high" level after the lapse of the dispersion delay time tD. Unlike the circuit operation shown in FIG. 4, the bit line sense amplifiers corresponding to the selected word lines are not controlled by the same bit line sense amplifier enable signals but are controlled by separate bit line sense amplifier enable signals which are active at different points in time. Thus, as shown in FIG. 5, bit line sense amplifiers start operating at different points in time according to the respective word lines. Accordingly, the magnitude of a peak power current $I_{CC}$ is lowered thereby decreasing peak power consumption.

In FIG. 5, the point in time in which the plurality of word lines WL0_0 and WL4_0 are activated is identical, however, it is possible to make the point in time at which the word lines WL0_0 and WL4_0 are activated different. Namely, the word line WL0_0 is firstly activated to a logic "high" level and then word line WL4_0 is activated to a logic "high" level after the lapse of the dispersion delay time tD. Thus, the bit line sense amplifier activation point is dispersed in time and the word line activation points are dispersed in time. When the period from the point in time at which the word line is activated to the point in time at which the corresponding bit line sense amplifier is driven is excessively long, a soft error rate SER due to alpha particles increases and the system fails. Therefore, the plurality of word lines are preferably sequentially activated at the same time the bit line sense amplifier drives the bit lines as shown in FIG. 5.

However, since an additional circuit is required for dispersing the word line activating point, the plurality of word lines are simultaneously activated as shown in FIG. 5 where the period tl from the point in time at which the word line WL4_0 is activated to the point in time at which the bit line sense amplifier enable signal PS1 is activated is limited.

Figure 6A:
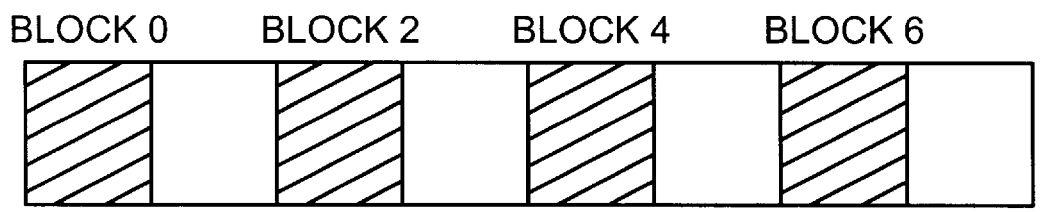
FIGS. 6A and 6B are block diagrams of an alternate embodiment refresh method of the present invention where four blocks are simultaneously refreshed.
Figure 6B:
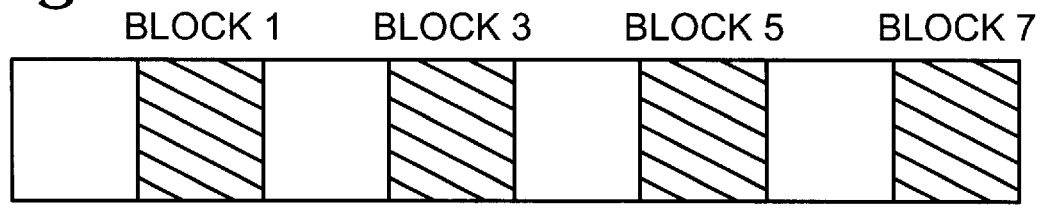

FIGS. 6A and 6B show the case in which four blocks are simultaneously refreshed. When the semiconductor memory array is constructed by eight blocks, block 0, block 2, block 4, and block 6 are simultaneously refreshed and block 1, block 3, block 5, and block 7 are simultaneously refreshed. Thus, the number of the word lines selected at one time is four.

Figure 7:
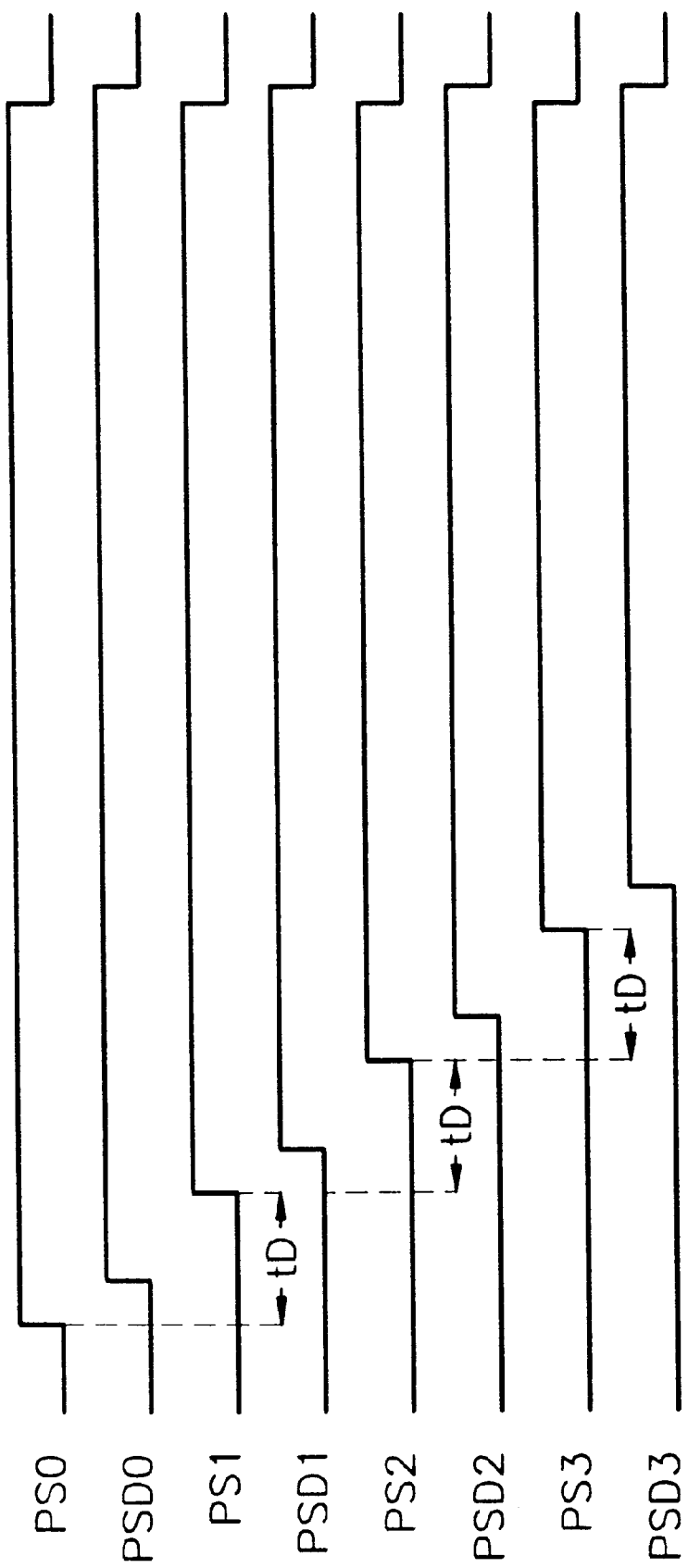
FIGS. 7 is a timing diagrams of the bit line sense amplifier control signals for the refresh method shown in FIGS. 6A and 6B.

FIG. 7 shows the bit line sense amplifier enable signals for the refresh method of the present invention, and in particular, that the bit line sense amplifier enable signals are activated at different times where four word lines included in each of four different blocks are activated at one time as shown in FIGS. 6A and 6B.

Figure 8:
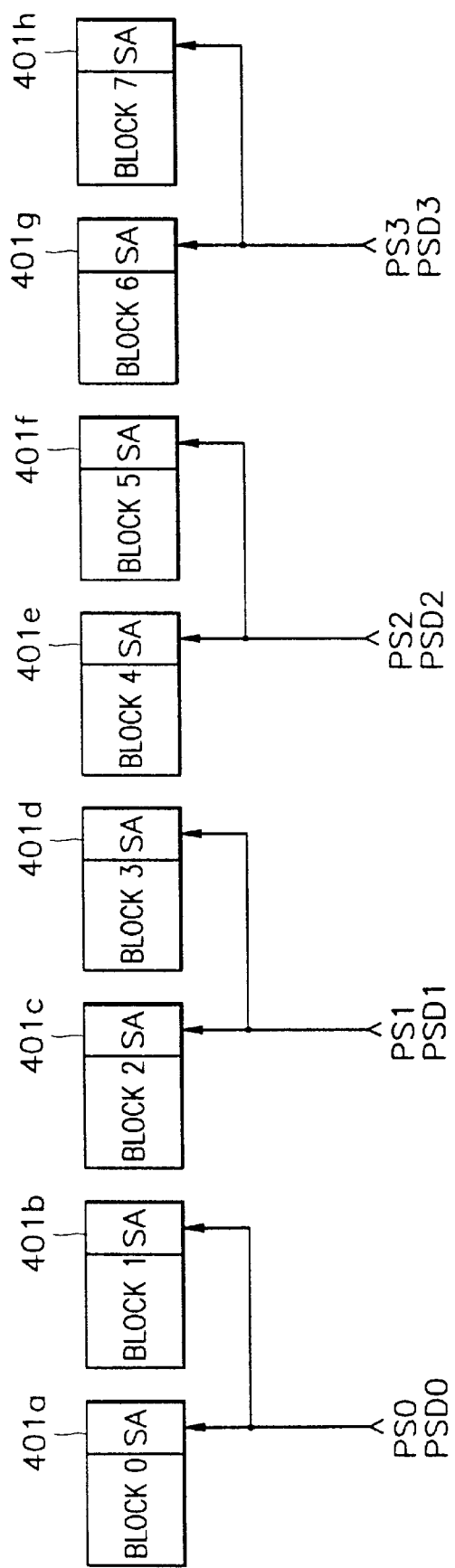
FIG. 8 is a block diagram of the refresh method shown in FIGS. 6A and 6B.

The bit line sense amplifier enable signals PS0, PSD0, PS1, PSD1, PS2, PSD2, PS3, and PSD3 whose activating points occur at different times are applied to corresponding bit line sense amplifiers 401a to 401h as shown in FIG. 8. Namely, the bit line sense amplifier enable signals PS0 and PSD0 control bit line sense amplifiers 401a and 401b corresponding to block 0 and block 1, respectively. The bit line sense amplifier enable signals PS1 and PSD1 control bit line sense amplifiers 401c and 401d corresponding to block 2 and block 3, respectively. The bit line sense amplifier enable signals PS2 and PSD2 control bit line sense amplifiers 401e and 401f corresponding to block 4 and block 5, respectively. The bit line sense amplifier enable signals PS3 and PSD3 control bit line sense amplifiers 401g and 401h corresponding to block 6 and block 7, respectively. As shown in FIG. 7, the bit lines sense amplifier enable signals are sequentially activated. The time difference between the point at which the bit line sense amplifier enable signals are activated is the dispersion delay time tD.

Figure 9:
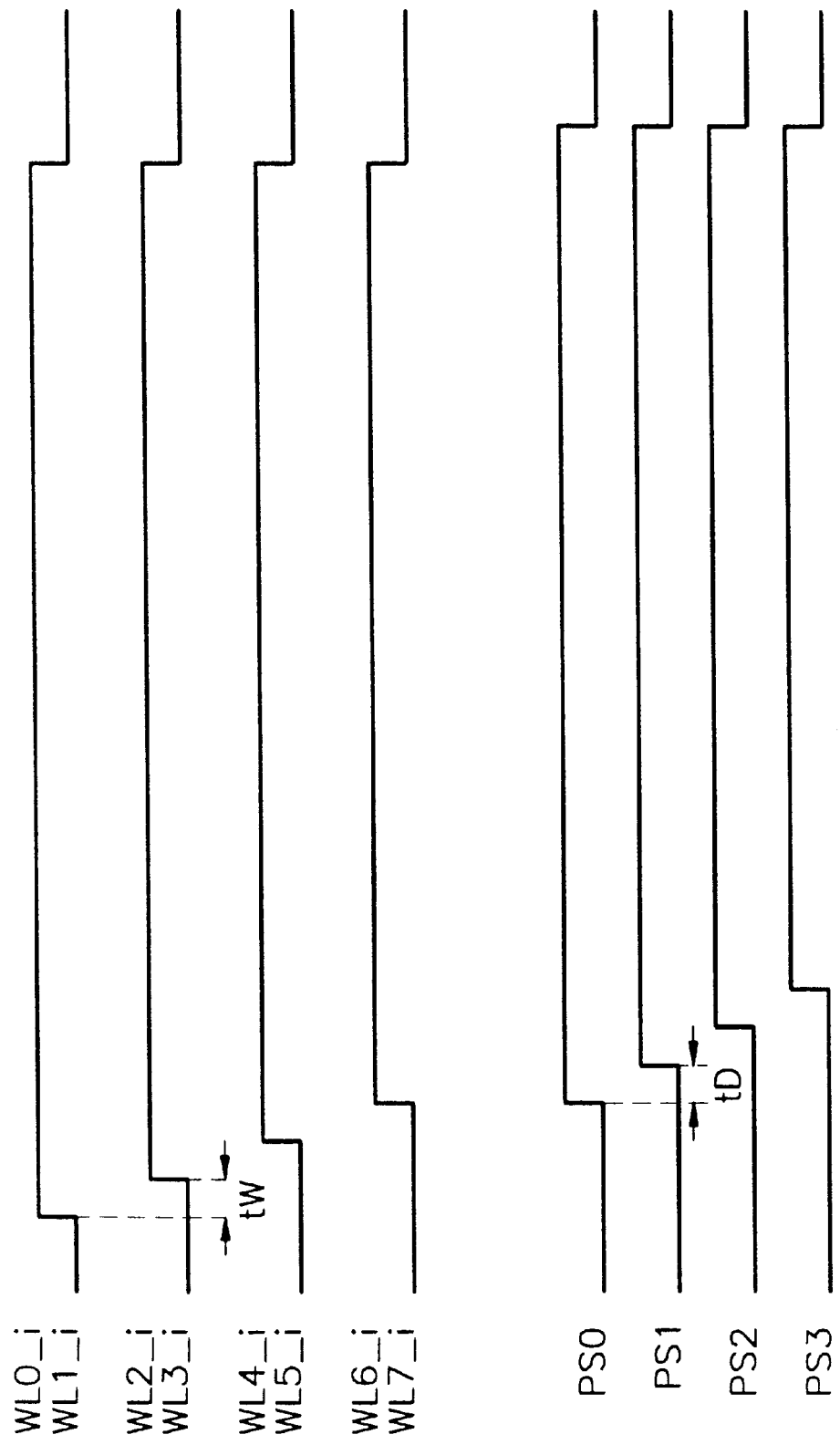
FIG. 9 is a timing diagram of the word line control signals for an alternate embodiment refresh method.

FIG. 9 shows the signal waveforms for the refresh method of the present invention where four word lines are simultaneously refreshed as shown in FIGS. 6A and 6D and where the word lines are sequentially activated. Reference numerals WL0_i to WL7_i respectively refer to the word lines included in block 0 to block 7. The word line dispersion delay time tW for delaying the word line activating points is shown in FIG. 9 as identical to the dispersion delay time tD for delaying the bit line sense amplifier activating points. However, it is possible for the word line dispersion delay time tW to be different from the bit line dispersion delay time tD.

Figure 10:
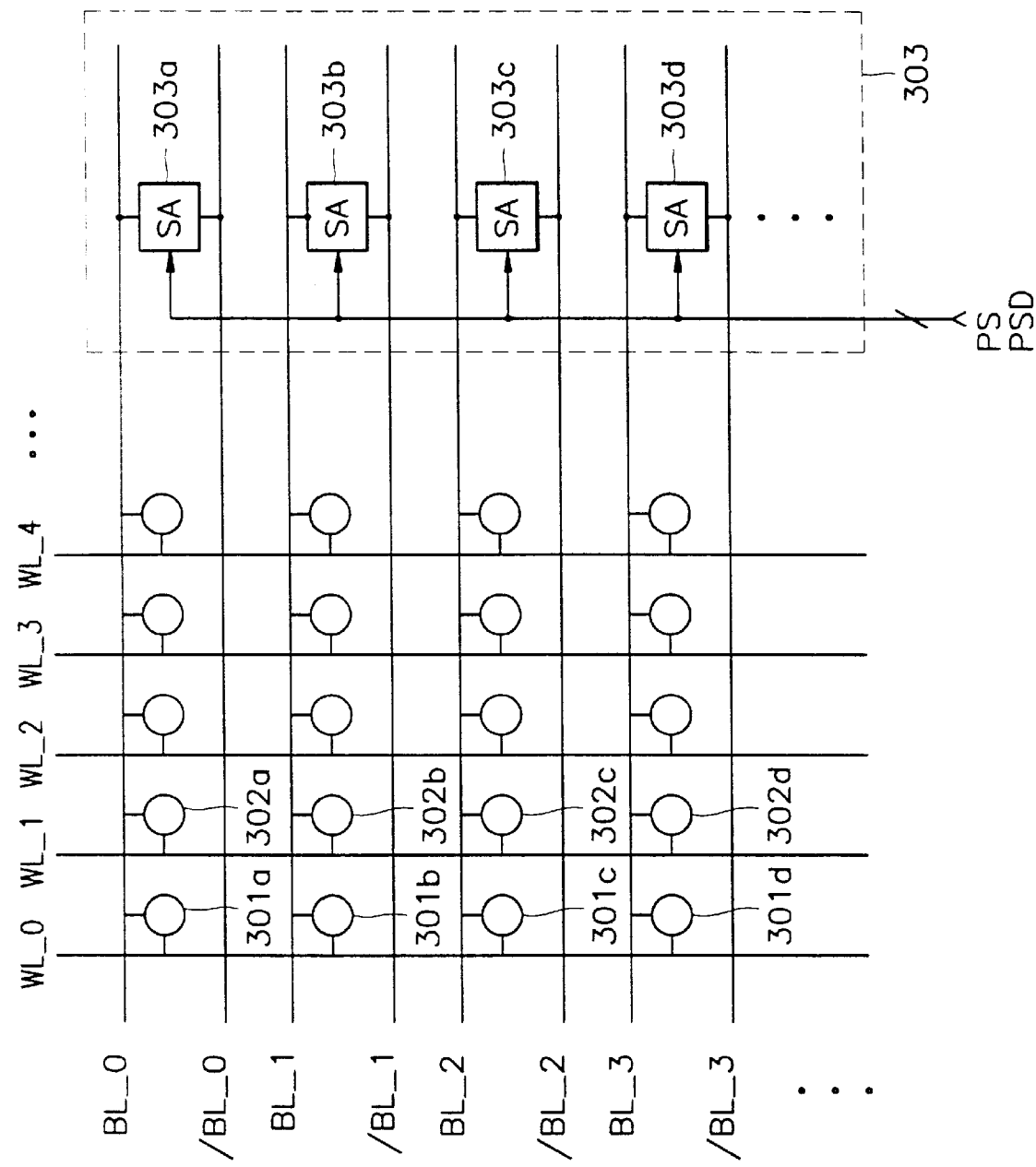
FIG. 10 is a block diagram of the refresh method shown in FIG. 9.

FIG. 10 schematically shows the structure of the blocks and the bit line sense amplifiers corresponding thereto. In the refresh operation of one block, only one of the plurality of word lines WL_0, WL_1, WL_2, WL_3, WL_4, ... included in one block is selected and activated. For example, when the word line WL_0 is activated to a logic "high" level, the access transistors included in the memory cells 301a, 301b, 301c, 301d, etc. combined to the word line WL_0 are turned on. Thus, the voltage levels of the bit line BL_0 and the inverse bit line /BL_0 change according to the data stored in the memory cell 301a, the voltage levels of the bit line BL_1 and the inverse bit line /BL_1 change according to the data stored in the memory cell 301b, and so on. The charges stored in the respective memory cells are shared and the voltage levels of the bit lines and the inverse bit lines change according to the data contained therein. Thus, a plurality of bit line sense amplifiers 303a, 303b, 303c, 303d, etc. included in the bit line sense amplifier 303 are activated to thereby amplify the voltage difference between the bit lines and the inverse bit lines Thus, the charge before leaking is restored and accumulated in the capacitors of the memory cells 301a, 301b, 301c, 301d, etc. The selected word line WL_0 is then deactivated to a logic "low" level and the bit line sense amplifiers 303a, 303b, 303c, 303d, etc., are also deactivated. The refresh operation of one word line is completed in this manner. The above-described process is repeatedly performed when the memory cells combined to word line WL_1 are refreshed. As noted from FIG. 9, the plurality of memory cells are simultaneously refreshed by activating one word line. For example, when the number of memory cells combined to one word line is 2048, the refresh operation with respect to 2048 memory cells is performed whenever one word line is activated for which 2048 bit line sense amplifiers are simultaneously activated.

In such a block structure, it is impossible for two or more word lines to be simultaneously activated in one block and a refresh operation performed thereon. For example, when the word line WL_0 and the word line WL_1 are simultaneously activated, the bit line BL_0 and the inverse bit line /BL_0 lose the stored data since the charges stored in the memory cell 301a and the memory cell 302a are simultaneously charged and shared. Two or more word lines cannot be simultaneously activated in a single block. Therefore, in the semiconductor memory device constructed by a plurality of blocks each having the block structure shown in FIG. 10, the plurality of word lines activated at one time must be part of different blocks.

In the above-mentioned method for refreshing memory cell data, bit line sense amplifiers are activated at different times for different blocks. It is also possible to activate the bit line sense amplifiers at different times by dividing the bit line sense amplifiers for an identical block into two or more. This later method is explained further by reference to FIGS. 11 to 13.

Figure 11:
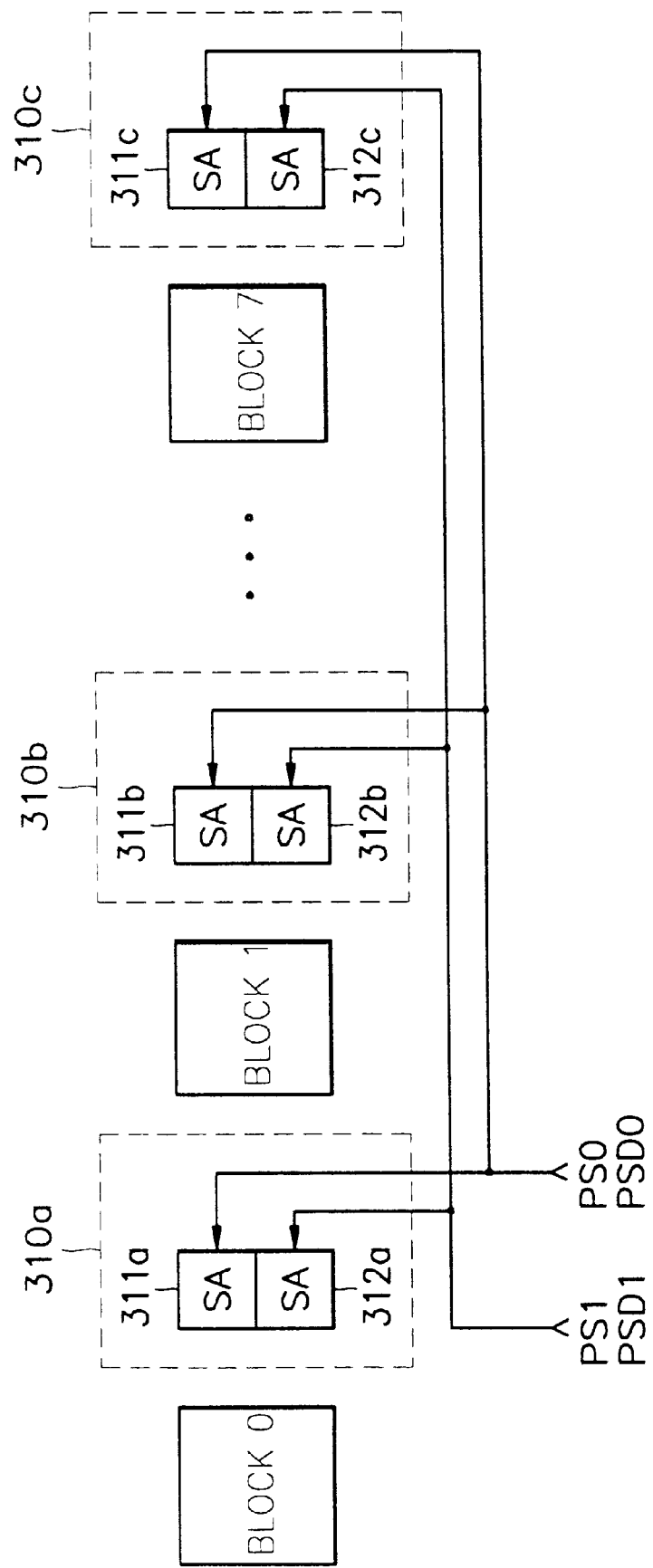
FIGS. 11 and 12 are block diagrams explaining a method for dividing a plurality of bit line sense amplifiers with respect to a single block into more than two sense amplifier groups.

Referring to FIG. 11, the semiconductor memory device is constructed by eight blocks (block 0 to block 7) having corresponding bit line sense amplifiers. When a word line included in block 0 is activated, the bit line sense amplifier 310a is activated, when a word line included in block 1 is activated, the bit line sense amplifier 310b is activated, and when a word line included in block 7 is activated, the bit line sense amplifier 310c is activated, and so on.

Figure 12:
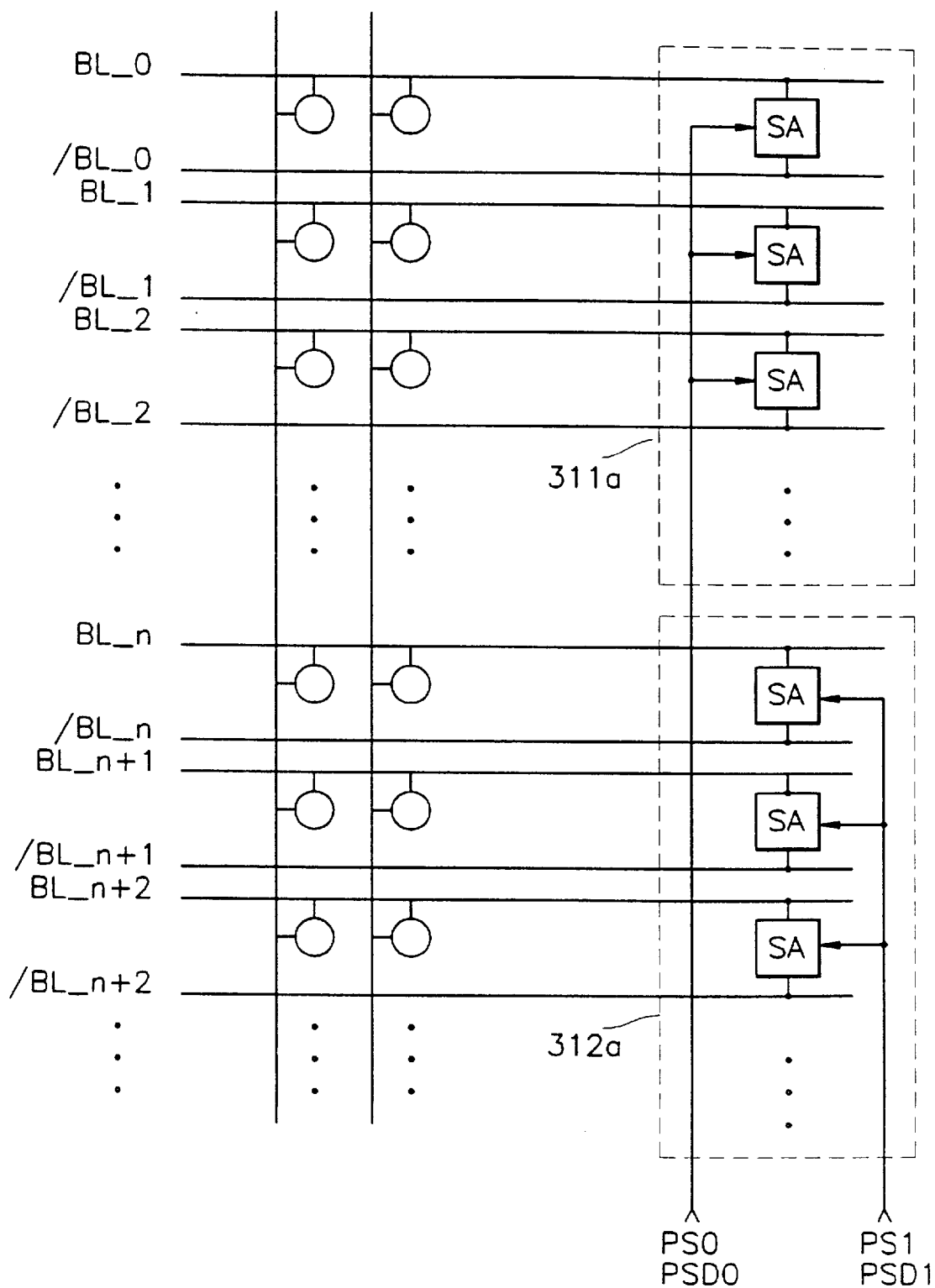
Figure 13:
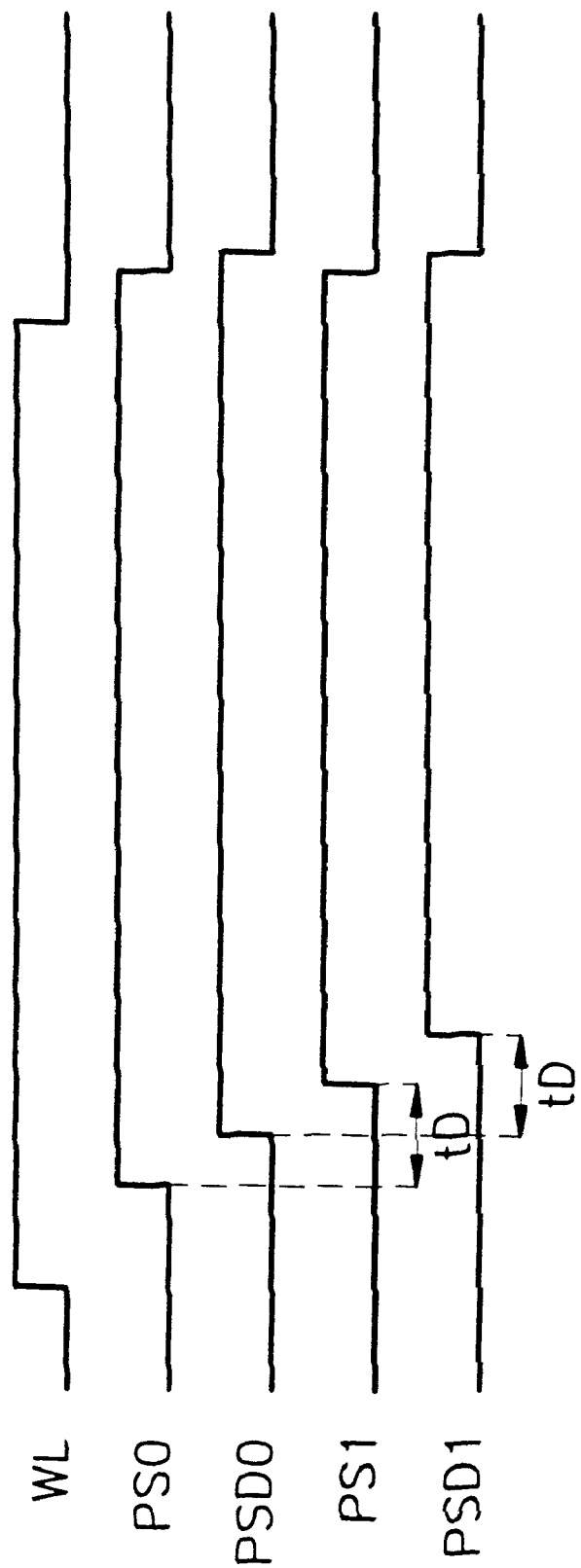
FIG. 13 is a timing diagram of the bit line sense amplifier control signals shown in FIG. 12.

Unlike the circuit shown in FIG. 8, a plurality of bit line sense amplifiers included in the bit line sense amplifying portion are divided into two groups in FIG. 11. For example, the plurality of bit line sense amplifiers included in the bit line sense amplifying portion 310a are divided into two groups of bit line sense amplifiers 311a and 312a. The first group of bit line sense amplifiers is activated first followed by activating the second group of bit line sense amplifiers 312a after the lapse of a predetermined dispersion delay time tD. A plurality of bit line sense amplifiers included in the bit line sense amplifying portions corresponding to the remaining blocks are also divided into two groups, like groups 311b and 312b and 311c and 312c. The remaining groups are activated in like manner to groups 311a and 312b. In FIG. 11, the bit line sense amplifier groups 311a, 311b, ..., 311c are activated by the bit line sense amplifier enable signals PS0 and PSD0 and the sense amplifier groups 312a, 312b, ..., 312c, are activated by the bit line sense amplifier enable signals PS1 and PSD1. The waveforms of the bit line sense amplifier enable signals applied to the bit line sense amplifier groups are shown in FIG. 13. FIG. 12 shows more detail of how the bit line sense amplifying portion shown in FIG. 11 is divided into two groups. The plurality of bit line sense amplifiers included in the plurality of bit line sense amplifying portions are divided such that the bit line sense amplifying portions corresponding to the same column line are included in the same group. Thus, the bit line sense amplifiers in the same group are activated at dispersed time.

Figure 14A:
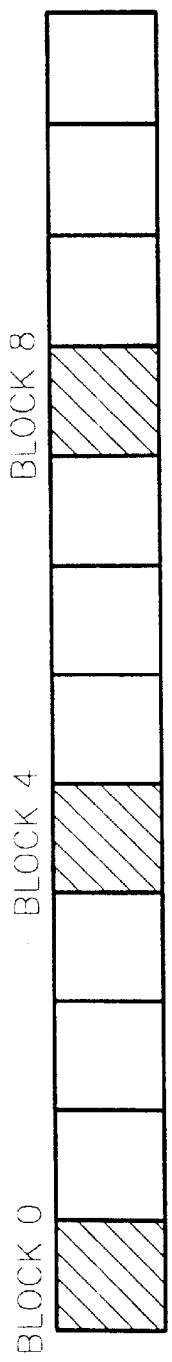
FIGS. 14A to 14D are block diagrams of an alternate embodiment refresh method of the present invention where three blocks are simultaneously refreshed.
Figure 14B:
Figure 14C:
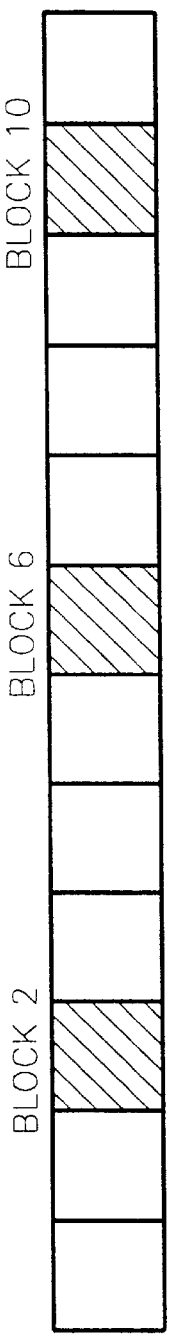
Figure 14D:
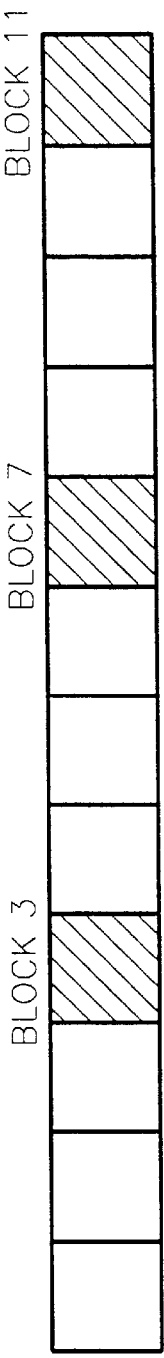

FIGS. 14A to 14D show the case in which refresh operations with respect to three word lines included in different blocks are simultaneously performed. The cell array of the semiconductor memory device shown in FIGS. 14A to 14D is constructed by 12 blocks and four refresh cycles are required. When 512 word lines are included in one block, the one block refresh cycle corresponds to 512 refresh cycles and the total required number of refresh cycles become 4×512. The refresh operations with respect to block 0, block 4, and block 8 are performed in the first block refresh cycle as shown in FIG. 14A. The refresh operations with respect to block 1, block 5, and block 9 are performed in the second block refresh cycle as shown in FIG. 14B. The refresh operations with respect to block 2, block 6, and block 10 are performed in the third block refresh cycle as shown in FIG. 14C. The refresh operations with respect to block 3, block 7, and block 11 are performed in the fourth block refresh cycle as shown in FIG. 14D. Such refresh operations are repeatedly performed until the automatic/self refresh mode ends.

Figure 15A:
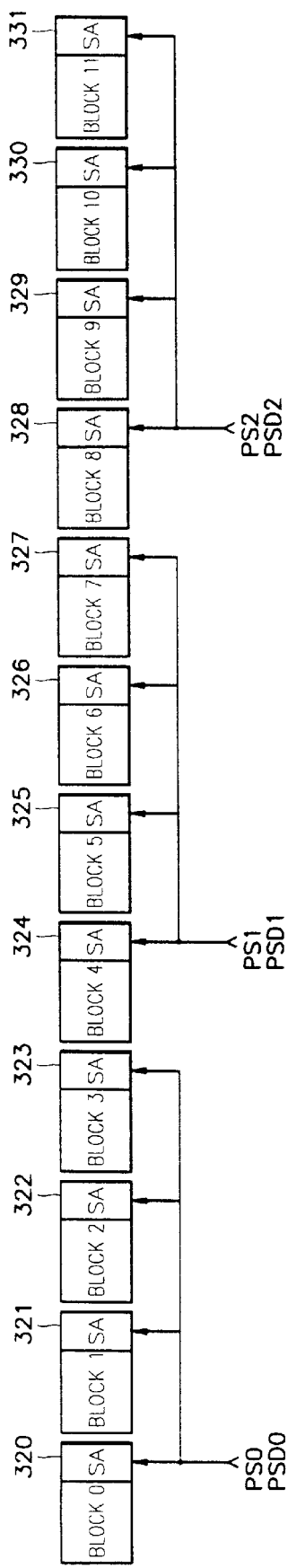
FIG. 15A is a block diagram of a memory system showing how the bit line sense amplifiers are activated at different points in time during refresh operations.
Figure 15B:
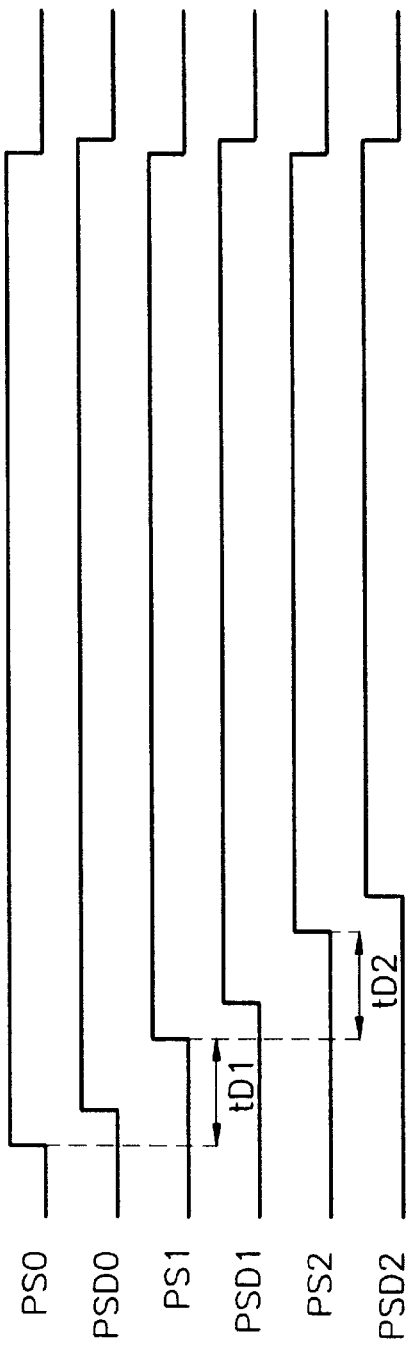
FIG. 15B is a timing diagram of the bit line sense amplifier enable signals corresponding to the selected bit line sense amplifiers.

FIG. 15A shows the structure in which the bit line sense amplifiers are activated at different times where refresh operations are performed with respect to the memory cells combined to three word lines. FIG. 15B shows the bit line sense amplifier enable signals corresponding to the bit line sense amplifiers. Referring to FIG. 15A, a plurality of bit line sense amplifying portions 320 to 331 corresponding to the plurality of blocks (block 0 to block 11) are formed. The bit line sense amplifying portions 320, 321, 322, and 323 are controlled by the bit line sense amplifier enable signals PS0 and PSD0. The bit line sense amplifying portions 324, 325, 326, and 327 are controlled by the bit line sense amplifier enable signals PS1 and PSD1. The bit line sense amplifying portions 328, 329, 330, and 331 are controlled by the bit line sense amplifier enable signals PS2 and PSD2. Therefore, the point in time at which each of the corresponding bit line sense amplifying portions is activated is distributed reducing the magnitude of the peak current even though the refresh operation is performed simultaneously with respect to three word lines included in different blocks during one refresh cycle. The distributed delay times tD1 and tD2 are uniformly set in FIG. 15B, however, it is possible to vary delay time tD1 from tD2. Also, it is possible to activate the word lines at different points in time corresponding to the points in time at which the bit line sense amplifiers are activated.

Figure 16:
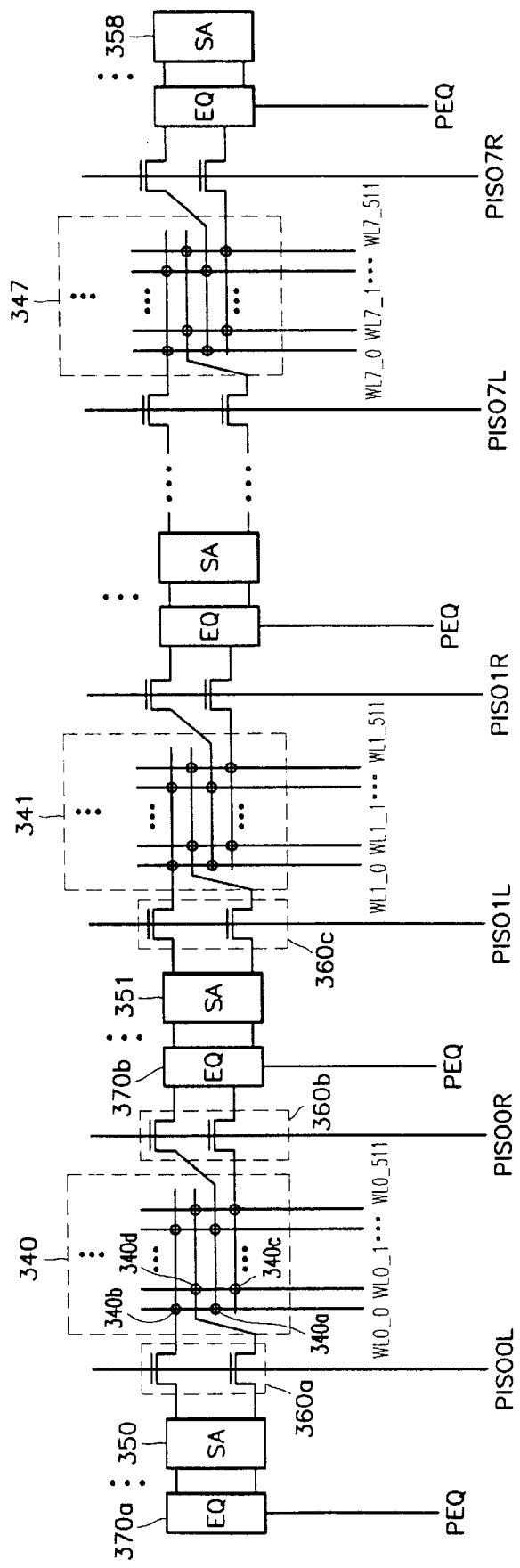
FIG. 16 is a schematic diagram of a semiconductor memory device having a shared bit line sense amplifier.

FIG. 16 schematically shows the semiconductor memory device having a shared bit line sense amplifier in which the bit line sense amplifiers are shared by two adjacent blocks. For example, bit line sense amplifier 351 is shared by block 340 and block 341. The bit line sense amplifiers 350 and 358 positioned at the edge are only for each block 340 or 347. When access is simultaneously gained to two adjacent blocks in such a structure, data contained in memory cells is lost. Therefore, access cannot be gained to two adjacent blocks. A general refresh operation will be described prior to describing a dispersion scheme.

The refresh operations with respect to the memory cells combined to the word line WL0_0 in block 340 will be described. If access to block 340 is gained, isolation gates 360a and 360b are turned on and an isolation gate 360c is turned off. The word line WL0_0 is activated to a logic "high" level thereby turning on the access transistors of the memory cells combined thereto and causing charge sharing between the bit lines. After performing the charge sharing operation, the bit line sense amplifiers 350 and 351 are activated, thus amplifying the voltage difference between the bit lines and the inverse bit lines and actively restoring the stored data. Thereafter, the word line WL0_0 is deactivated to a logic "low" level. The bit line sense amplifiers are deactivated and the equalizers 370a and 370b are activated, thus equalizing the charge on the bit lines and the inverse bit lines. Where the shared bit line sense amplifier is included, two bit line sense amplifying portions adjacent to a predetermined block are driven for the refresh operation with respect to the block. In FIG. 16, reference numerals WL0_0 to WL0_511 denote word lines in block 340, reference numerals WL1_0 to WL1_511 denote word lines in block 341, and reference numerals WL7_0 to WL7_511 denote word lines in block 347.

Figure 18:
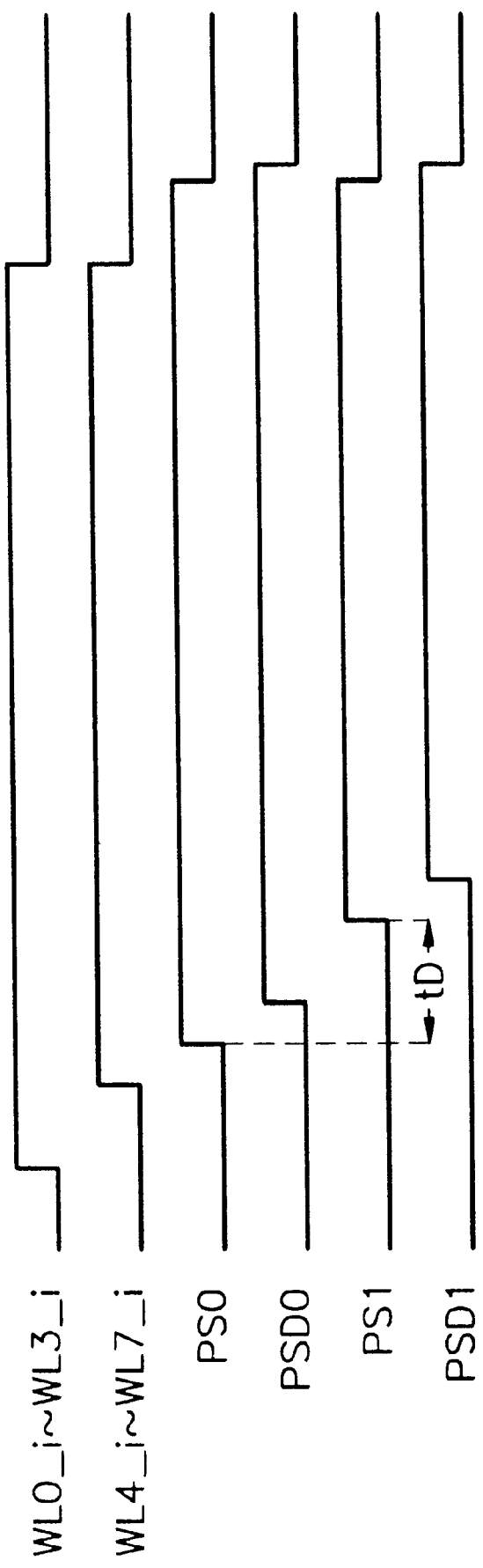

A plurality of word line refresh methods for a semiconductor memory device having a shared bit line sense amplifier shown in FIG. 16 and a scheme for activating the bit line sense amplifiers at different points in time according thereto are shown in FIGS. 17A to 17D and 18. FIGS. 17A to 17D respectively show the first to fourth block refresh cycles. The shaded blocks are the blocks to be refreshed. Two blocks are activated every one block refresh cycle and the plurality of bit line sense amplifiers which are activated at different points in time are divided into two groups. FIG. 18 shows the waveforms of the bit line sense amplifier enable signals shown in FIGS. 17A to 17D and those of related signals. In FIG. 18, only the activating points in time of the bit line sense amplifier enable signals are dispersed and the deactivating points in time of the bit line sense amplifier enable signals are coincident. However, the deactivating points in time of the bit line sense amplifier enable signals may be dispersed in the same way. Thus, the peak current generated at the deactivating points in time of the bit line sense amplifier enable signals can be reduced. In FIG. 18, the points in time of the word lines which are simultaneously activated are also dispersed. The dispersion of the word line activating points in time also reduces the soft error rate. The deactivating points in time of the word lines are coincident in FIG. 18, however, they can be also dispersed.

Figure 19:
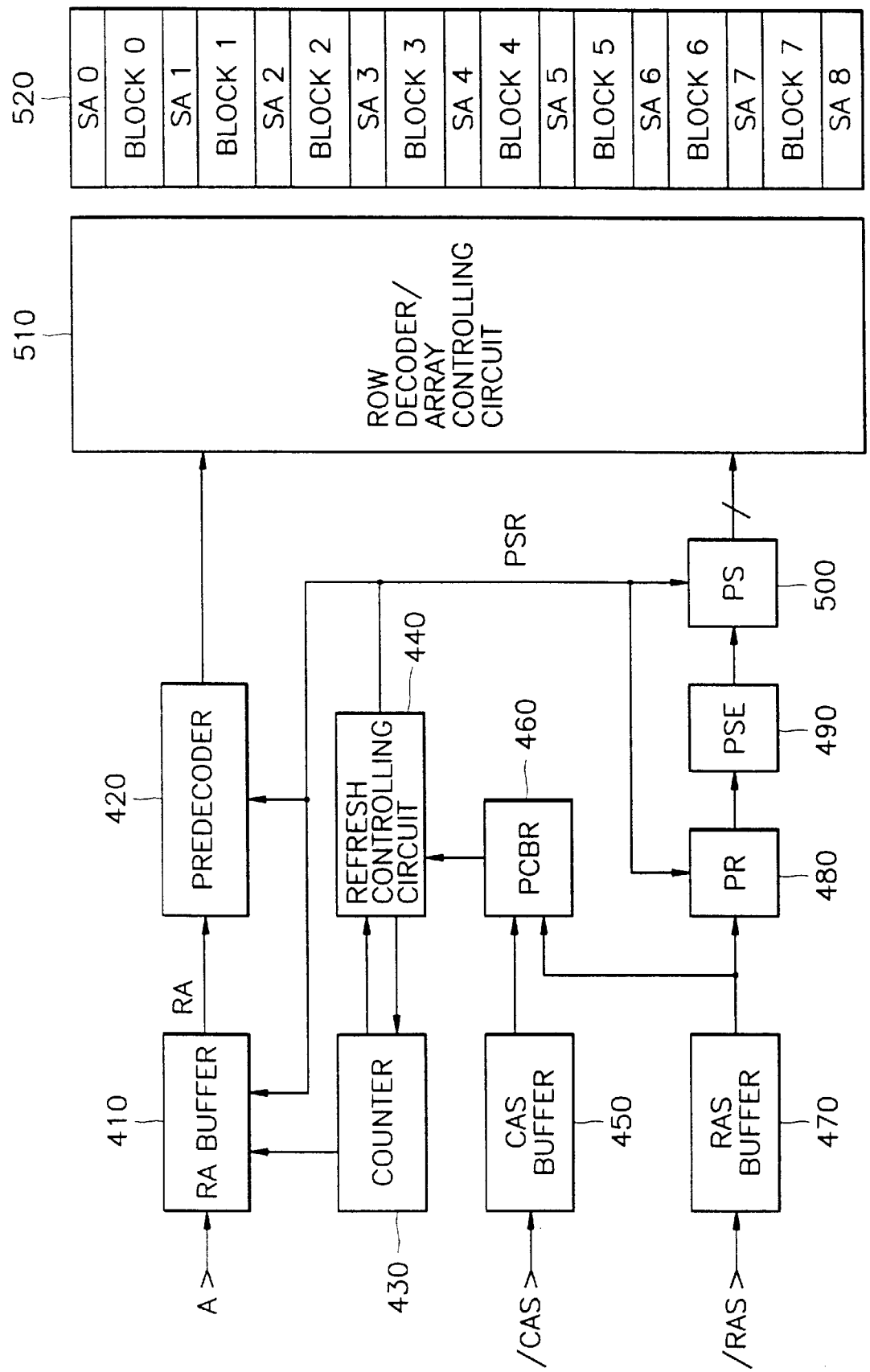
FIG. 19 is a schematic block diagram of a semiconductor memory device in which the refresh method according to FIGS. 17A to 17D and 18 can be performed.

FIG. 19 is a schematic block diagram of a semiconductor memory device in which the refresh method according to FIGS. 17A to 17D and 18 can be performed Referring to FIG. 19, the semiconductor memory device includes a memory cell array 520, a row decoder/array controlling circuit 510, a row address buffer 410, a predecoder 420, a counter 430, a refresh controlling circuit 440, a column address strobe buffer 450, a row address strobe buffer 470, a mode signal generating portion 460, a row active signal generating portion 480, a timing control signal generating portion 490, and a bit line sense amplifier enable signal generating portion 500.

The column address strobe buffer 450 and the row address strobe buffer 470 buffer the row address strobe signal /RAS and the column address strobe signal /CAS, respectively, received externally to the semiconductor memory device. The mode signal generating portion 460 receives the buffered output row address strobe signal /RAS and the buffered column address strobe signal /CAS from the column address strobe buffer 450. The mode signal generating portion 460 generates a mode signal PCBR (CAS before RAS) which is activated to a logic "high" level after the column address strobe signal /CAS is activated to a logic "low" level and the row address strobe signal /RAS is activated to a logic "low" level. The refresh controlling circuit 440 generates a refresh mode signal PSR which is at a logic "high" level after the lapse of predetermined time if a mode signal PCBR is at a logic "high" level. The refresh mode signal PSR shows whether a refresh mode is turned on. The refresh controlling circuit 440 controls the operation of the counter 430. The counter 430 is activated in the refresh mode and generates an address. The row address buffer 410 receives and buffers the address output from counter 430. Row address buffer 410 outputs the address received from counter 430 when the refresh mode is activated. When the refresh mode is disabled, row address buffer 410 receives and buffers the externally received address A, providing address A as the row address. The predecoder 420 predecodes and outputs the row address RA and provides the resulting address to the row decoder/array controlling circuit 510. The row active signal generating portion 480 and the timing control signal generating portion 490 generate the row active signal PR and the timing control signal PSE for controlling the timing of the operations related to the active row. The row active signal generating portion 480 generates the row active signal PR in a normal mode responsive to the output of row address strobe buffer 470. Row active signal generating portion 480 generates the row active signal PR having a certain period independent of the output of row address strobe buffer 470 in the refresh mode.

Figure 23A:
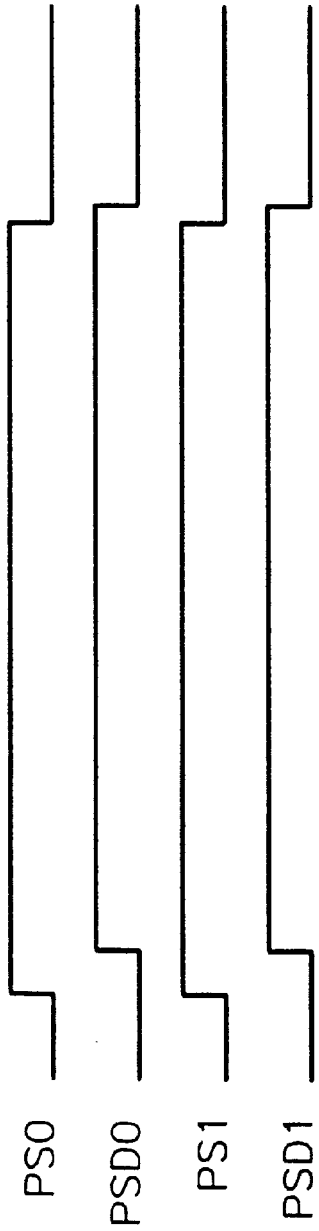
FIG. 23A is a timing diagram of bit line sense amplifier enable signals PS0, PSD0, PS1, and PSD1 in a normal mode.
Figure 23B:
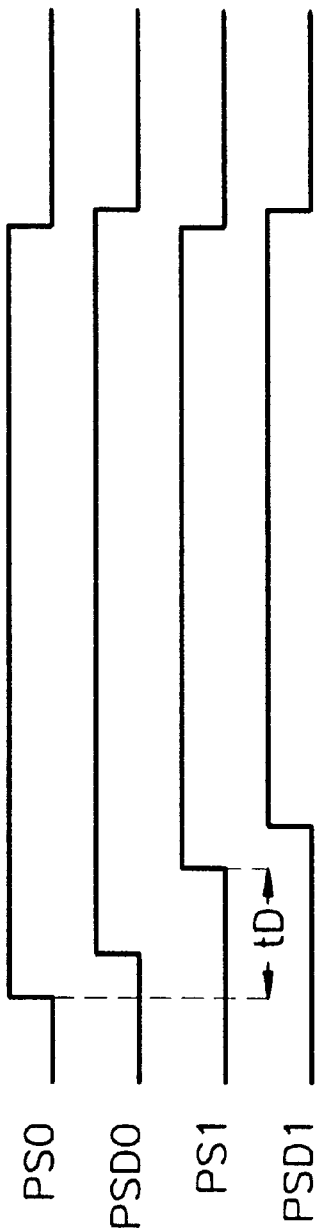
FIG. 23B is a timing diagram of bit line sense amplifier enable signals PS0, PSD0, PS1, and PSD1 in a refresh mode.

The bit line sense amplifier enable signal 500 responds to the timing control signal PSE and generates the bit line sense amplifier enable signals PS0, PSD0, PS1, and PSD1. The waveforms of the signals generated in the bit line sense amplifier enable signal generating portion 500 vary according to the refresh mode signal PSR. The waveforms of the bit line sense amplifier enable signals PS0, PSD0, PS1, and PSD1 in the normal mode are shown in FIG. 23A and the waveforms of the bit line sense amplifier enable signals PS0, PSD0, PS1, and PSD1 in the refresh mode are shown in FIG. 23B. As noted from FIGS. 23A and 23B, the point in time at which the bit line sense amplifiers are active are not dispersed in the normal mode. In contrast, the point in time at which the bit line sense amplifiers are active are dispersed in the refresh mode.

Row address decoding will now be described in more detail. The row address determines which one of the plurality of word lines is selected. Therefore, the construction of the row address is closely related to the hierarchical structure of the semiconductor memory device. For example, when the memory cell array 520 is constructed by eight blocks and 512 word lines are included in each block, the row address is constructed by 12 bits in which 3 bits of block information and 9 bits of sub address information are added.

The row address is applied external to the semiconductor memory device in the normal mode. The row address is generated internal to the semiconductor memory device in the refresh mode. Where access to two or more word lines is gained in the refresh method according to the present invention, it is difficult to fully achieve peak performance by only changing the input path of the row address. The block select signal generating portion for decoding the block information and generating a plurality of block select signals should be constructed to operate differently depending on the state of the refresh mode signal PSR. The block select signal generating portion decodes the block information among the row addresses and generates a plurality of block select signals in the normal mode and generates a plurality of block select signals two or more of which are activated in the pre-defined refresh scheme (refer to FIGS. 2A to 2D, 6A and 6B, and 14A to 14D) in the refresh mode. Therefore, only one of the block select signals is selectively activated in the normal operation mode, however, two or more are selectively activated in the refresh mode. The block select signals which are generated in the refresh mode are used for selecting the word line in the row decoder and controlling the operations of the bit line sense amplifiers and the isolated gates. The block select signal generating portion is generally included in predecoder 420, however, it can be included in other circuit portions according to the row address decoding scheme.

Figure 20:
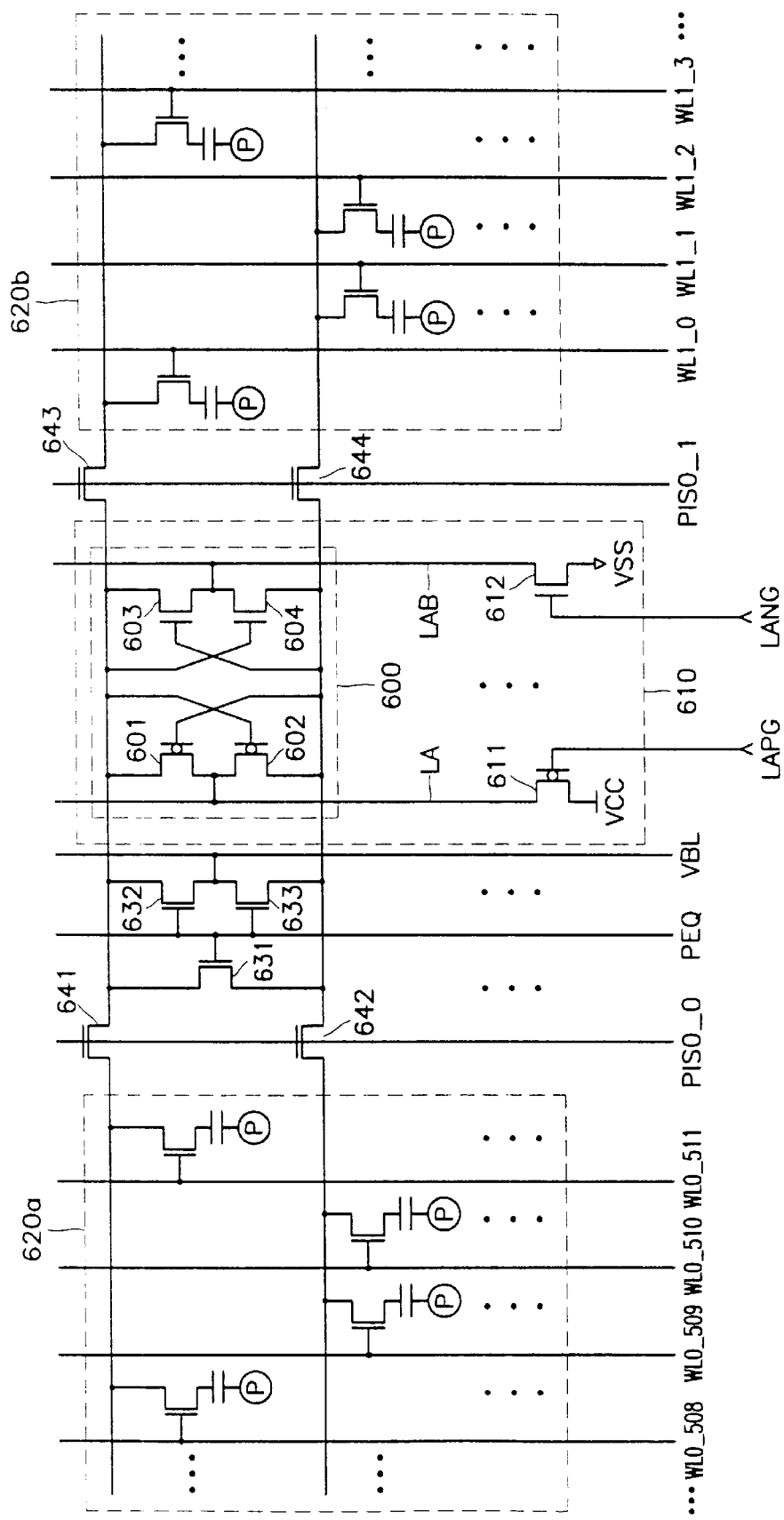
FIG. 20 is a schematic diagram of the shared bit line sense amplifier and related circuitry.

FIG. 20 shows an embodiment of the shared bit line sense amplifying portion and related circuitry in detail. A bit line sense amplifier 600 includes two cross-coupled PMOS transistors 601 and 602 and two cross-coupled NMOS transistors 603 and 604. The number of bit line sense amplifier 600 included in one bit line sense amplifying portion equals the number of bit lines divided by two. A bit line sense amplifying portion 610 further includes a PMOS transistor 611 and an NMOS transistor 612 operating as drivers. When a control signal LAPG is a logic "low" level, PMOS transistor 611 is turned on and node LA changes to a power voltage VCC level. When this happens, bit line sense amplification by PMOS transistors 601 and 602 included in bit line sense amplifier 600 is performed. When the control signal LANG is at a logic "high" level, NMOS transistor 612 is turned on and node LAB changes to an earth voltage VSS level. When this happens, bit line sense amplification by NMOS transistors 603 and 604 included in the bit line sense amplifier 600 is performed. The bit line sense amplifying portion 610 is coupled to both block 620a and block 620b. NMOS transistors 631, 632, and 633 form the bit line equalizer and precharger while NMOS transistors 641 to 644 are isolated gates.

Figure 21:
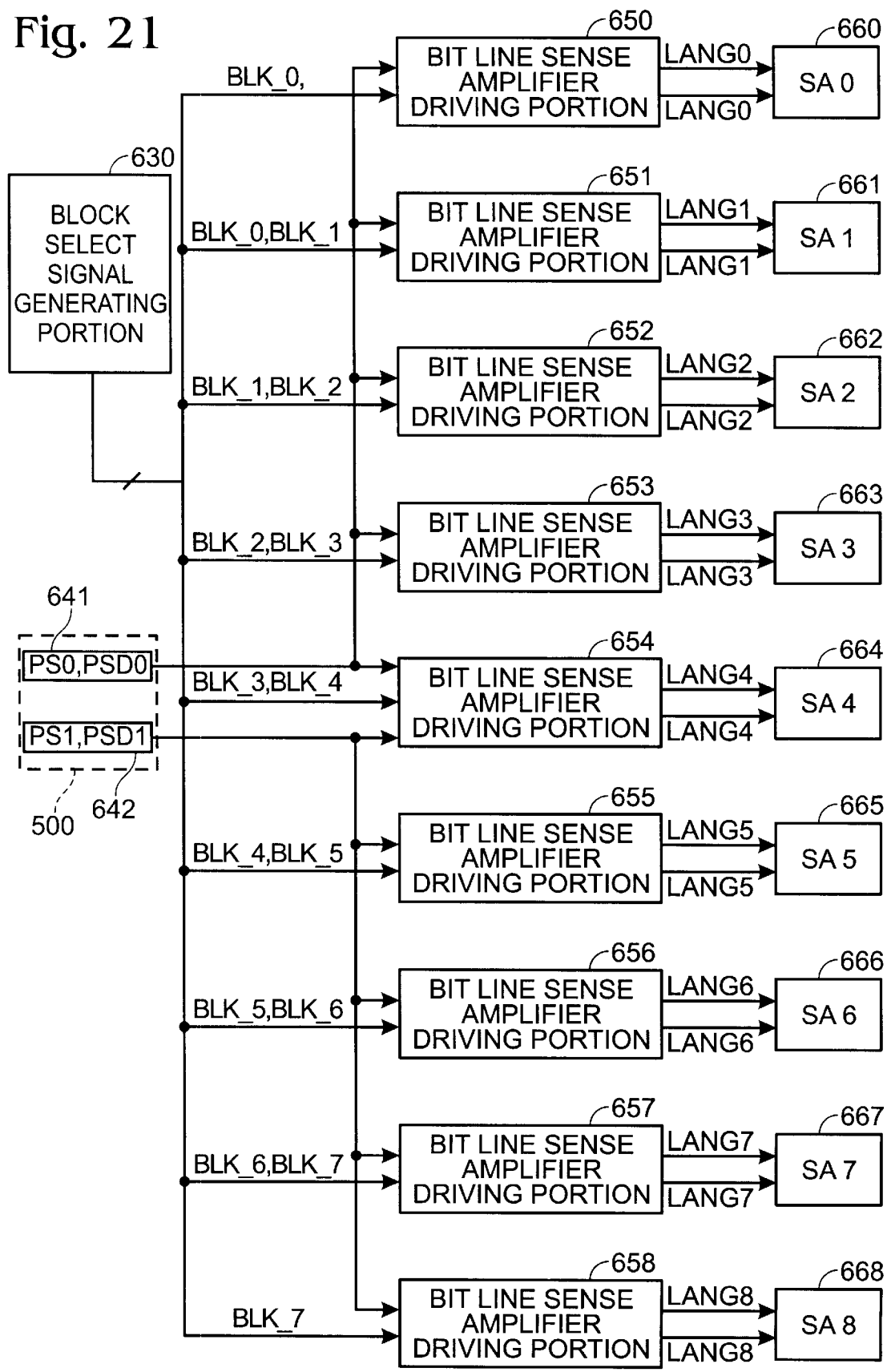
FIG. 21 is a block diagram of the bit line sense amplifier control circuitry for performing the refresh method according to the present invention.

FIG. 21 is a block diagram of the control circuit of the bit line sense amplifying portions for performing the refresh method of the present invention. In FIG. 21, the bit line sense amplifying portions have the shared bit line sense amplifier structure shown in FIG. 20. Namely, bit line sense amplifiers 661 through 667 are shared by two adjacent blocks and bit line sense amplifiers 660 and 668 are shared by only one adjacent block. The circuit shown in FIG. 21 is particularly useful for performing the plurality of word line refresh scheme shown in FIGS. 17A through 17D.

A plurality of bit line sense amplifier driving portions 650 through 658 are provided corresponding to the plurality of bit line sense amplifiers 660 through 668. The bit line sense amplifier driving portions 650 through 658 respectively input corresponding block select signals BLK_0 through BLK_7 and bit line sense amplifier enable signals PS0, PSD0, PS1, and PSD1 and generate corresponding bit line sense amplifier drive signals LANG0 through LANG8 and LAPG0 through LAPG8. Presently, preferred embodiments of the detailed constructions of the bit line sense amplifier driving portions 650 through 658 are respectively shown in FIGS. 24A through 24I.

A block select signal generating portion 630 decodes block information from the row addresses externally applied to the semiconductor memory device and outputs eight block select signals in a normal mode. Only one of the eight block select signals is selectively activated in the normal mode. In contrast, two of the block select signals are selectively activated in the refresh mode. A block select signal BLK_0 and a block select signal BLK_4 are activated in the first block refresh cycle, a block select signal BLK_1 and a block select signal BLK_5 are activated in the second block refresh cycle, a block select signal BLK_2 and a block select signal BLK_6 are activated in the third block refresh cycle, and a block select signal BLK_3 and a block select signal BLK_7 are activated in the fourth block refresh cycle. The above-described cycle is continuously repeated during the refresh mode.

The bit line sense amplifier enable signal generating portion 500 is constructed by a PS0 and PSD0 signal generating portion 641 and a PS1 and PSD1 signal generating portion 642. The bit line sense amplifier enable signals PS0 and PSD0 are applied to bit line sense amplifier driving portions 650 to 654 and the bit line sense amplifier enable signals PS1 and PSD1 are applied to the bit line sense amplifier driving portions 654 to 658. The PS0 signal and the PS1 signal are for controlling the activating points in time of the NMOS transistors included in the bit line sense amplifier. The PSD0 signal and the PSD1 signal are for controlling the activating points in time of the PMOS transistors included in the bit line sense amplifier.

In FIG. 21, the block select signal generating portion 630 is included in the predecoder of FIG. 21 and the bit line sense amplifier driving portions 650 to 658 are included in the array controlling circuit.

Figure 22:
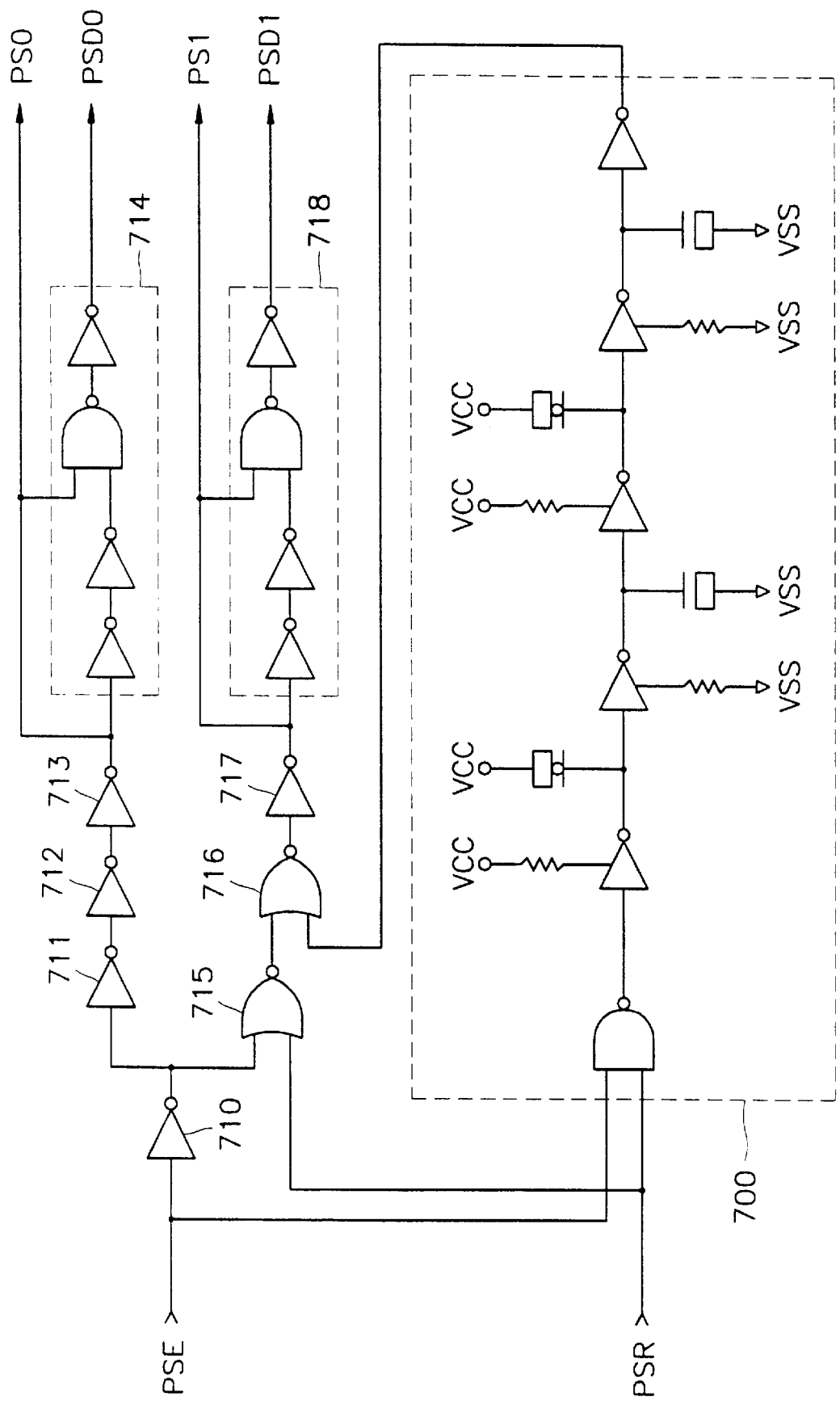
FIG. 22 is a schematic diagram of the bit line sense amplifier enable signal generating portion 500 shown in FIGS. 19 and 21.

FIG. 22 shows an embodiment of the bit line sense amplifier enable signal generating portion 500 shown in FIGS. 19 and 21.

Referring to FIG. 22, timing control signal PSE is triggered by row active signal PR and controls the bit line sensing timing. Inverters 710, 711, 712 and 713 delay and buffer the timing control signal PSE and output the bit line sense amplifier enable signal PS0. Delaying portion 714 delays the bit line sense amplifier enable signal PS0 and outputs the bit line sense amplifier enable signal PSD0.

NOR gate 715 receives the output of an inverter 710 and refresh mode signal PSR. Therefore, the output of the NOR gate 715 is masked to a logic "low" level in refresh mode and follows the phase change of the timing control signal PSE in normal mode.

A dispersion delaying portion 700 comprises a NAND gate, and a plurality of inverters, MOS capacitors, and resistors. Dispersion delaying portion 700 delays timing control signal PSE and row active signal PSR by an RC (resistance-capacitance delay) time constant. Dispersion delaying portion 700 outputs a delayed timing control signal PSE when the refresh mode signal PSR is at a logic "high" level. Dispersion delaying portion 700 outputs a logic "low" level signal when refresh mode signal PSR is at a logic "low" level.

| PSR = high | output = delayed PSE |
|---|---|
| PSR = low | output = low |

NOR gate 716 receives the output of NOR gate 715 and the output of the dispersion delay portion 700. The output of NOR gate 716 is the inverse of the output signal of dispersion delay portion 700 in the refresh mode and the inverse of the output signal of NOR gate 715 in the normal mode. The inverter 717 outputs the bit line sense amplifier enable signal PS1 by inverting the output of NOR gate 716. Delay portion 718 delays the bit line sense amplifier enable signal PS1 and outputs the bit line sense amplifier enable signal PSD1. If the delay time by inverters 710, 711, 712 and 713 is t1 and the delay time by dispersion delay portion 700, NOR gate 716, and inverter 717 is t2, the dispersion delay time tD equals t2–t1.

Figure 24A:
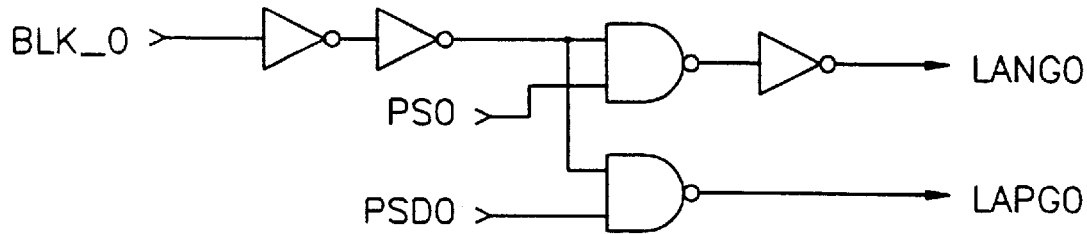
FIGS. 24A to 24I are schematic diagrams of alternative embodiments of bit line sense amplifier driving portions shown in FIG. 21.

FIG. 24A shows an embodiment of the bit line sense amplifier driving portion 650 shown in FIG. 21. The bit line sense amplifier driving signal LANGO is activated to a logic "high" level when the block signal BLK_0 is at a logic "high" level and the bit line sense amplifier enable signal PS0 is at logic "high" level. The bit line sense amplifier driving signal LAPGO is activated to a logic "low" level when the block select signal BLK_0 is at a logic "high" level and the bit line sense amplifier enable signal PSD0 is at a logic "high" level. Namely, the bit line sense amplifier driving signals LANG0 and LAPG0 are respectively activated according to the bit line sense amplifier enable signals PS0 and PSD0 when block 0 is selected.

Figure 24B:
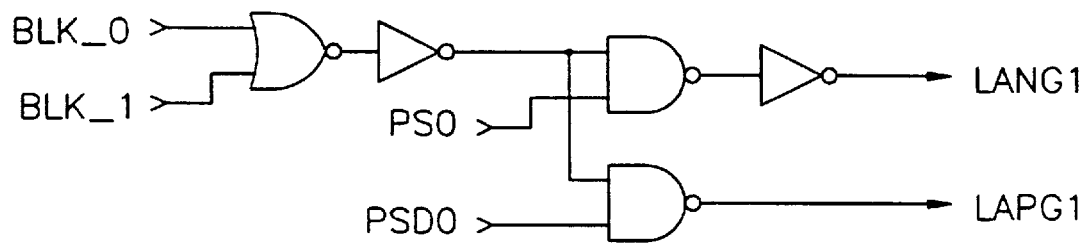
Figure 24C:
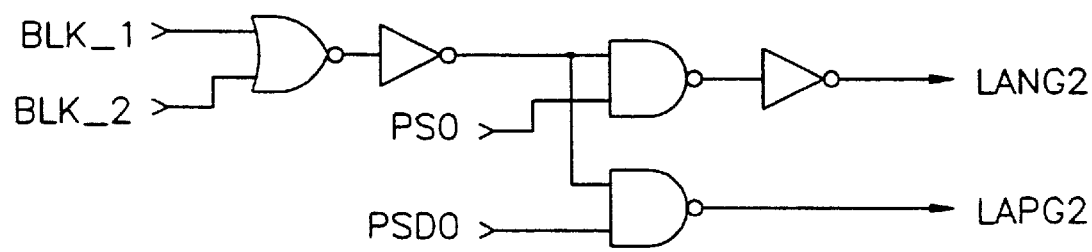
Figure 24D:
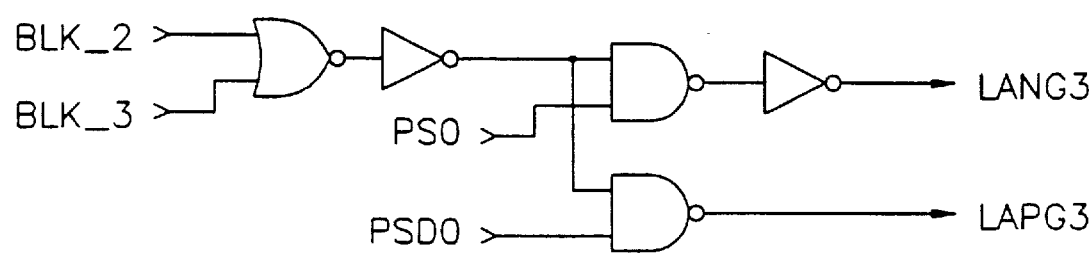

FIG. 24B shows an embodiment of a detailed circuit of the bit line sense amplifier driving portion 651 shown in FIG. 21. Bit line sense amplifier driving signals LANG1 and LAPG1 are respectively activated according to the bit line sense amplifier enable signals PS0 and PSD0 when the block select signal BLK_0 is at a logic "high" level or die block select signal BLK_1 is at a logic "high" level. FIGS. 24C and 24D respectively show an embodiment of the detailed circuits of the bit line sense amplifier driving portions 652 and 653 shown in FIG. 21 having the same construction as that of FIG. 24B. The bit line sense amplifier driving portions 652 and 653 generate the bit line sense amplifier driving signals which are respectively activated according to the bit line sense amplifier enable signals PS0 and PSD0 when one of the corresponding block select signals is activated to a logic "high" level.

Figure 24E:
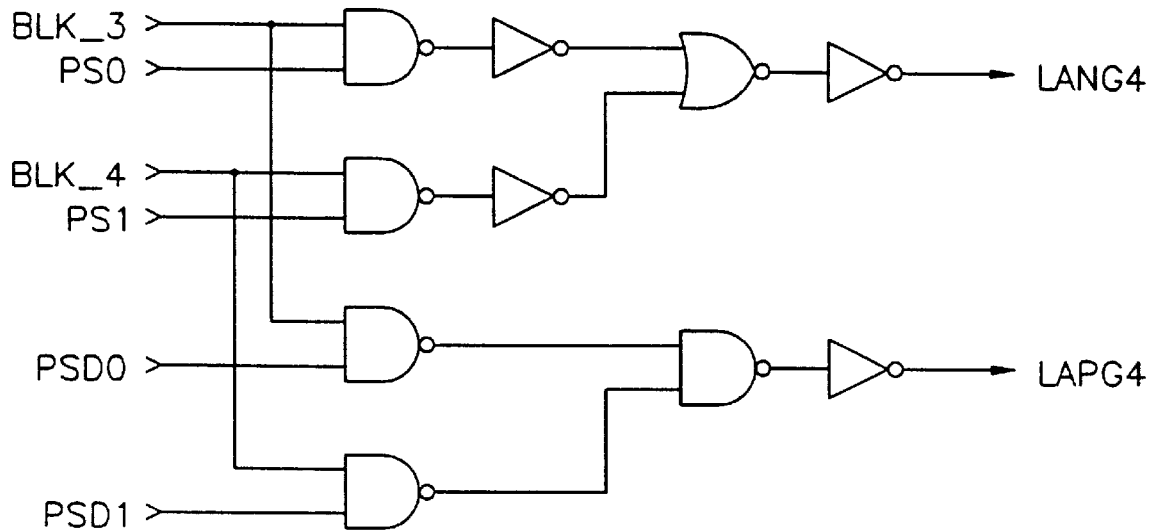

FIG. 24E shows an embodiment of the bit line sense amplifier driving portion 654 shown in FIG. 21. Bit line sense amplifier enable signals PS1 and PSD1 as well as bit line sense amplifier enable signals PS0 and PSD0 are all received as input signals. Bit line sense amplifier driving signals LANG4 and LAPG4 are respectively activated according to bit line sense amplifier enable signals PS0 and PSD0 when block select signal BLK_3 is at a logic "high" level and are respectively activated according to the bit line sense amplifier enable signals PS1 and PSD1 when the block select signal BLK_4 is at a logic "high" level.

Figure 24F:
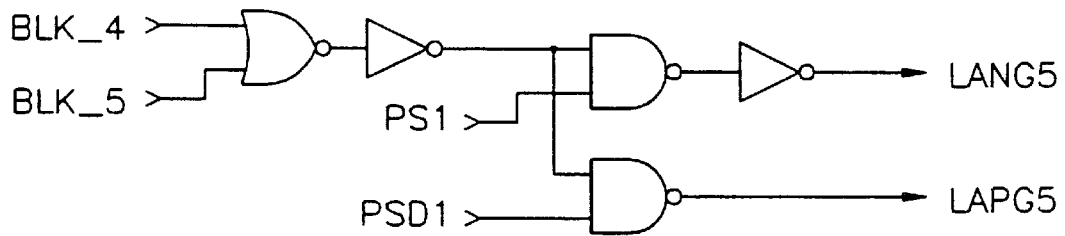
Figure 24G:
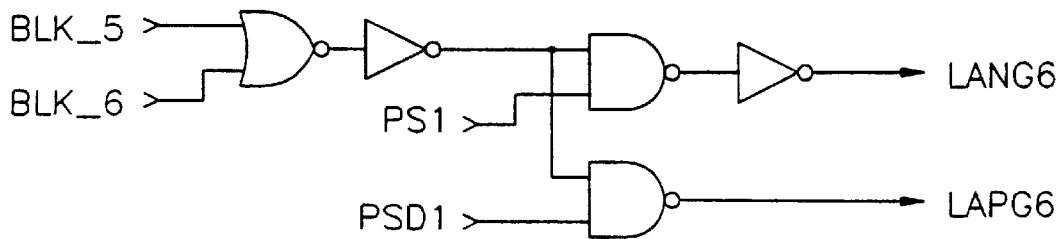
Figure 24H:
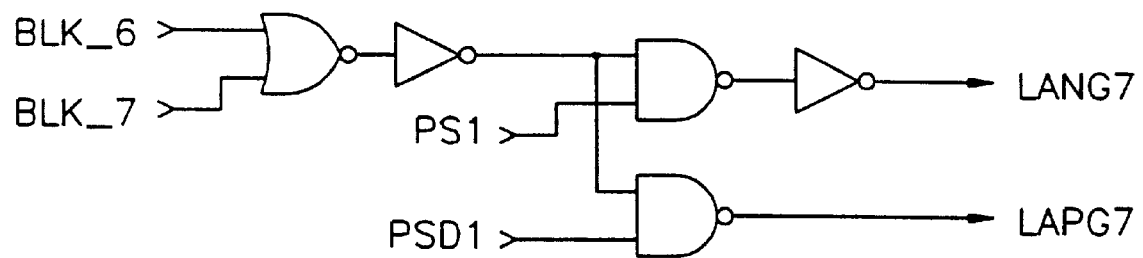

FIGS. 24F and 24H show an embodiment of the bit line sense amplifier driving portions 655, 656, and 657 shown in FIG. 21 having the same construction as that of FIG. 24B. The bit line sense amplifier driving portions 655, 656, and 657 generate the bit line sense amplifier driving signals which are respectively activated according to the bit line sense amplifier enable signals PS1 and PSD1 when one of the corresponding block select signals is activated to a logic "high" level.

Figure 24I:
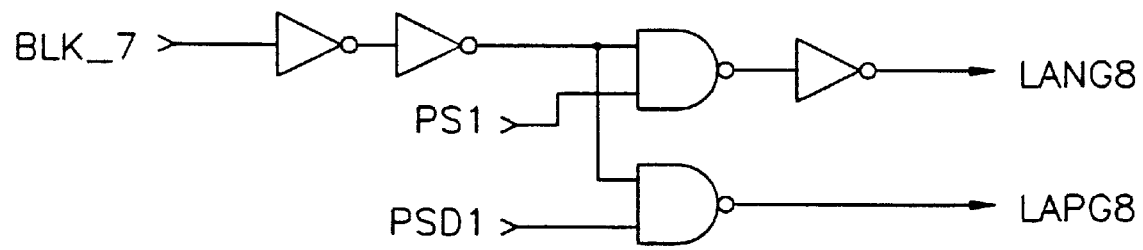

FIG. 24I shows an embodiment of the bit line sense amplifier driving portion 658 shown in FIG. 21 having the same construction as that of FIG. 24A. The bit line sense amplifier driving portion 658 generate bit line sense amplifier driving signals LANG8 and LAPG8 which are respectively activated according to the bit line sense amplifier enable signals PS1 and PSD1 when the block select signal BLK_7 is at a logic "high" level.

Figure 25:
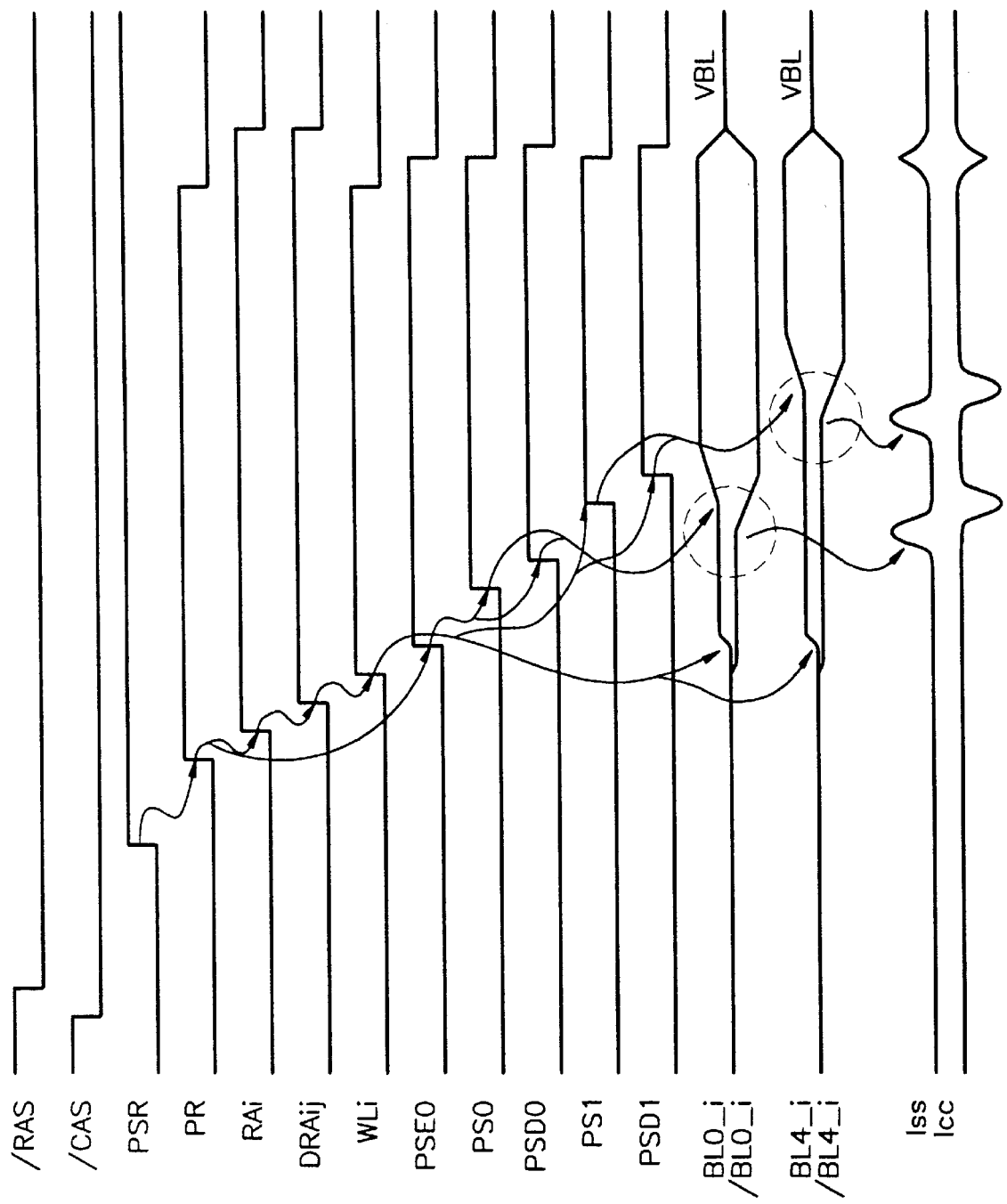
FIG. 25 is a timing diagram of the signals in case of performing the refresh operation in the semiconductor memory device shown in FIGS. 19 to 24I.

FIG. 25 shows the signal waveforms when the refresh operation is performed in the semiconductor memory device shown in FIGS. 19 to 24I.

Referring to FIG. 25, column address strobe signal /CAS is activated to a logic "low" level, row address strobe signal /RAS is activated to a logic "low" level, and refresh mode signal PSR is activated to a logic "high" level after the lapse of a predetermined period, e.g., 100 μs, thereby setting the refresh mode.

After setting the refresh mode, row active signal PR having a certain period is generated. Row address buffer 410 outputs the row address signal RAi responsive to row active signal PR. Row address signal RAi output from row address buffer 410 is obtained by buffering the output of counter 430. Row address signal RAi is decoded in the predecoder. Signal DRAij shows the output of the predecoder. The output of the predecoder is constructed by the block select signals and the decoded sub addresses when the row address is constructed by the block information and the sub address. The selected word lines WLi is activated to a logic "high" level according to the block select signals and the decoded sub address. Timing control signal PSE is activated to a logic "high" level after the lapse of predetermined time after the row active signal PR is activated to a "high" level and a plurality of bit line sense amplifier enable signals PS0, PSD0, PS1 and PSD1 having different activating points in time are generated responsive to the timing control signal PSE. The bit line sense amplifier of bit line BL0_i and the inverse bit line /BL0_i is controlled by bit line sense amplifier enable signals PS0 and PSD0 and the bit line sense amplifier of bit line BL4_i and the inverse bit line /BL4_i is controlled by the bit line sense amplifier enable signals PS1 and PSD1. Therefore, the peak current generated when the bit line sense amplifier is activated is divided by two. The scheme in which the activating points in time and the deactivating points in time of the selected word lines are dispersed and the scheme in which the bit line sense amplifier deactivating points in time are dispersed are not shown in FIG. 25. However, they can be easily deduced by anyone skilled in the art in a manner similar to the scheme of dispersing the bit line sense amplifier activating points in time.

The present invention is restricted to logic "high" level activation of the respective signals. However, it is clearly understood that anyone skilled in the art can design a circuit using inverse logic. In the scheme of dispersing the activating points in time of the bit line sense amplifier, a method for dividing a plurality of bit line sense amplifiers included in one block into several groups and activating them at different points in time can be employed other than the method for dispersing the activating points in time in each block. Also, it is possible to scramble a plurality of blocks without sequentially selecting them.

It is possible to reduce the magnitude of the peak current which may be generated in case of simultaneously gaining accesses to a plurality of word lines in the refresh operation of a semiconductor memory device. Since excessive peak currents are the main cause of system battery damage it is possible to stabilize operation of a battery based system by reducing the magnitude of the peak current. Also, it is possible to reduce stand-by power consumption in the refresh mode and to stabilize the refresh operation by decreasing the refresh cycle period by simultaneously accessing a plurality of word lines.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A refresh circuit for a semiconductor memory device having a plurality of memory cells formed at intersecting points of a plurality of word lines with a plurality of bit lines, comprising:
    a plurality of bit line sense amplifiers coupled to groups of bit lines;
    a control circuit for generating a refresh mode signal;
    a block select signal generating circuit for generating a plurality of block select signals responsive to the refresh mode signal, two or more block select signals activating two or more word lines, the two or more word lines being sequentially enabled with a word line dispersion delay time interposed therebetween, the two or more word lines being active when the refresh mode signal is in a first logic state;
    a bit line sense amplifier enable signal generating circuit for generating a plurality of bit line sense amplifier enable signals responsive to the refresh mode signal, each of the plurality of bit line sense amplifier enable signals being sequentially enabled with a bit line dispersion delay time interposed therebetween; and
    a bit line sense amplifier driving circuit for driving the plurality of bit line sense amplifiers responsive to the bit line sense amplifier enable signals and corresponding block select signals.

2. The refresh circuit of claim 1 including a row active signal generating circuit for generating a row active signal responsive to the refresh mode signal and a counter for generating a row address responsive to the refresh mode signal.

3. The refresh circuit of claim 2 wherein the semiconductor memory devices includes eight blocks and wherein the bit line sense amplifier driving circuit includes nine shared bit line sense amplifying portions,
    said block select signal generating circuit generating eight block select signals such that a first block and a fifth block are enabled in a first block refresh cycle, a second and a sixth block are enabled in a second refresh cycle, a third and a seventh block are enabled in a third refresh cycle, and a fourth and an eighth block are enabled in a fourth refresh cycle;
    said bit line sense amplifier enable signal generating circuit generating each of the plurality of bit line sense amplifier enable signals at dispersed points in time; and
    said bit line sense amplifier driving circuit controlling the points in time at which each of the bit line sense amplifying portions are enabled responsive to the bit line sense amplifier enable signals.

4. The refresh circuit of claim 1 further comprising a timing control signal generating circuit coupled to the control circuit and the row active signal generating circuit for generating a timing control signal responsive to the row active signal.

5. The refresh circuit of claim 4 wherein the bit line sense amplifier enable signal generating circuit includes:
    a first buffering circuit for generating a first bit line sense amplifier enable signal by delaying and buffering the timing control signal;
    a first delaying portion for generating a second bit line sense amplifier enable signal by delaying the first bit line sense amplifier enable signal;
    a dispersion delay circuit for delaying the timing control signal when the timing control signal is in a first logic state;
    a second buffering circuit for generating a third bit line sense amplifier enable signal by delaying and buffering the timing control signal when the refresh mode signal is in a second logic state or by delaying and buffering the delayed timing control signal output from the dispersion delay circuit when the refresh mode signal is in the first logic state; and
    a second delaying portion for generating a fourth bit line sense amplifier enable signal by delaying the third bit line sense amplifier enable signal.

6. The refresh circuit of claim 1 wherein the plurality of bit line sense amplifiers are divided such that the bit line sense amplifiers corresponding to the same column line are included in the same group.

7. A refresh circuit for a semiconductor memory device, comprising:
    a plurality of bit line sense amplifiers;
    a refresh control circuit for generating a refresh mode signal responsive to a memory address;
    a word line enable generating circuit for generating a plurality of word line enable signals responsive to a row address, at least two word lines being sequentially enabled when the refresh mode signal is in a first logic state;
    a bit line sense amplifier enable signal generating circuit for generating a plurality of bit line sense amplifier enable signals responsive to the refresh mode signal, each of the plurality of bit line sense amplifier enable signal being sequentially enabled; and
    a plurality of bit line sense amplifier driving circuits for driving the plurality of bit line sense amplifiers responsive the word line enable signals and the bit line sense amplifier enable signals.

8. A method for refreshing data stored in a plurality of memory cells in a semiconductor memory device, the semiconductor memory device having a plurality of memory cells formed at intersecting points of a plurality of word lines with a plurality of bit lines and inverse bit lines, the method comprising:
    precharging the plurality of bit lines and inverse bit lines to a predetermined voltage level;
    enabling two or more word lines;
    enabling at least one bit line sense amplifier corresponding to one of the two or more enabled word lines during a first time period;
    enabling at least one bit line sense amplifier corresponding to another of the two or more enabled word lines during a second time period;

interposing a bit line dispersion delay time between the first and the second time periods;

refreshing charge stored in memory cells corresponding to the enabled bit line sense amplifiers;

disabling the enabled word lines; and sequentially disabling the enabled bit line sense amplifiers.

9. The method of claim 1 including equalizing the charge on the plurality of bit lines and inverse bit lines.

10. The method of claim 1 including:

grouping the plurality of memory cells into a plurality of blocks;

selecting two or more blocks of memory cells; and sequentially enabling the word lines in each of the two or more selected blocks of memory cells.

11. The method of claim 10 wherein sequentially enabling the word lines in each of the two or more selected blocks includes:

enabling a first word line in one of the two or more selected blocks of memory cells during a third time period;

enabling a second word line in another of the two or more selected blocks of memory cells during a fourth time period; and interposing a word line dispersion delay time between the third and fourth time periods.

12. The method of claim 11 wherein the bit line dispersion delay time and the word line dispersion delay time are equal.

13. The method of claim 1 wherein disabling the selected word lines includes:

disabling the at least one bit line sense amplifier corresponding to one of the two or more enabled word lines during a third time period;

disabling the at least one bit line sense amplifier corresponding to another of the two or more enabled word lines during a fourth time period; and interposing a second bit line dispersion delay time between the third and fourth time periods.

14. The method of claim 13 wherein the bit line dispersion delay time and the second bit line dispersion delay time are equal.

15. The method of claim 10 including:

arranging the memory cells so as to form $2^N$ memory blocks; and selecting two of the $2^N$ memory cell blocks;

wherein enabling two or more word lines includes enabling a single word line in each selected block.

16. The method of claim 15 wherein selecting two of the eight memory cell blocks includes:

enabling block 0 and block 4 in a first block refresh cycle by enabling a single word line in each of block 0 and block 4;

enabling block 1 and block 5 in a second block refresh cycle by enabling a single word line in each of block 1 and block 5;

enabling block 2 and block 6 in a third block refresh cycle by enabling a single word line in each of block 2 and block 6;

enabling block 3 and block 7 in a fourth block refresh cycle by enabling a single word line in each of block 3 and block 7; and repeatedly executing the first, second, third, and fourth block refresh cycles during a refresh mode period.

17. The method of claim 1 wherein each bit line sense amplifier includes a pair of cross-coupled PMOS transistors and a pair of cross-coupled NMOS transistors and wherein enabling the bit line sense amplifiers includes:

driving an NMOS transistor of each of the enabled bit line sense amplifiers; and driving a PMOS transistor of each of the enabled bit line sense amplifiers.

18. A method for refreshing data stored in a plurality of memory cells in a semiconductor memory device, the semiconductor memory device having a plurality of memory cells formed at intersecting points of a plurality of word lines with a plurality of bit lines and inverse bit lines, the method comprising:

precharging the plurality of bit lines and inverse bit lines to a predetermined voltage level;

enabling two or more word lines;

grouping the plurality of bit line sense amplifiers corresponding with one of the two or more enabled word lines into two or more groups;

enabling a first group of the two or more groups of bit line sense amplifiers during a first time period;

enabling a second group of the two or more groups of bit line sense amplifiers during a second time period;

interposing a bit line dispersion delay time between the first and second time periods;

refreshing charge stored in memory cells corresponding to the enabled bit line sense amplifiers;

disabling the enabled word lines; and sequentially disabling the enabled bit line sense amplifiers.

19. The method of claim 18 wherein grouping the plurality of bit line sense amplifiers includes grouping the plurality of bit line sense amplifiers belonging to like column lines.

* * * * *